United States Patent
Tanaka et al.

(10) Patent No.: US 9,871,108 B2
(45) Date of Patent: Jan. 16, 2018

(54) NITRIDE SEMICONDUCTOR DEVICE

(71) Applicant: ROHM CO., LTD., Kyoto (JP)

(72) Inventors: Taketoshi Tanaka, Kyoto (JP); Norikazu Ito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/135,130

(22) Filed: Apr. 21, 2016

(65) Prior Publication Data

US 2016/0315180 A1 Oct. 27, 2016

(30) Foreign Application Priority Data

Apr. 23, 2015 (JP) ................................. 2015-088663
Apr. 15, 2016 (JP) ................................. 2016-082382

(51) Int. Cl.
*H01L 29/207* (2006.01)
*H01L 29/778* (2006.01)
*H01L 29/20* (2006.01)
*H01L 29/40* (2006.01)
*H01L 29/423* (2006.01)

(52) U.S. Cl.
CPC ........ *H01L 29/207* (2013.01); *H01L 29/7786* (2013.01); *H01L 29/2003* (2013.01); *H01L 29/402* (2013.01); *H01L 29/42376* (2013.01)

(58) Field of Classification Search
CPC ... H01L 29/207; H01L 29/7786; H01L 29/77; H01L 29/778
See application file for complete search history.

(56) References Cited

U.S. PATENT DOCUMENTS

2011/0241017 A1* 10/2011 Ikeda .................. H01L 29/0847
257/76
2013/0113018 A1* 5/2013 Wakita .................. H01L 29/205
257/190
2013/0313609 A1* 11/2013 Akutsu .................. H01L 29/78
257/192

(Continued)

FOREIGN PATENT DOCUMENTS

JP 5064824 B2 10/2012

*Primary Examiner* — Fazli Erdem
(74) *Attorney, Agent, or Firm* — Rabin & Berdo, P.C.

(57) ABSTRACT

A nitride semiconductor device according to the present invention includes a nitride semiconductor layer having a gate, a source and a drain and a field plate on the nitride semiconductor layer electrically connected to the gate or the source, where when it is assumed that a drain voltage value where the value of $C_{OSS}$ is reduced to one half of a value when a drain voltage is 0 V is $V_1$, the dielectric breakdown voltage of the device is $V_2$, a gate length is $L_g$, a field plate length is $L_{fp}$, a shallow acceptor concentration is $N_A$, a deep acceptor concentration is $N_{DA}$, a vacuum permittivity is $\in_0$ and the relative permittivity of the nitride semiconductor layer is $\in$, formulas (1) and (2) below are satisfied.

$$V_1 < q(N_A + N_{DA}) \cdot L_g^2 / 2 \in_0 \in \quad (1)$$

$$V_2 < q(N_A + N_{DA}) \cdot (L_g + L_{fp})^2 / 2 \in_0 \in \quad (2)$$

19 Claims, 21 Drawing Sheets

(56) References Cited

U.S. PATENT DOCUMENTS

2013/0341640 A1* 12/2013 Sakurai ............ H01L 29/42316
                                                        257/77
2015/0028390 A1*  1/2015 Colino ............... H01L 29/7786
                                                        257/194
2016/0268408 A1*  9/2016 Oasa .................. H01L 29/7786

* cited by examiner

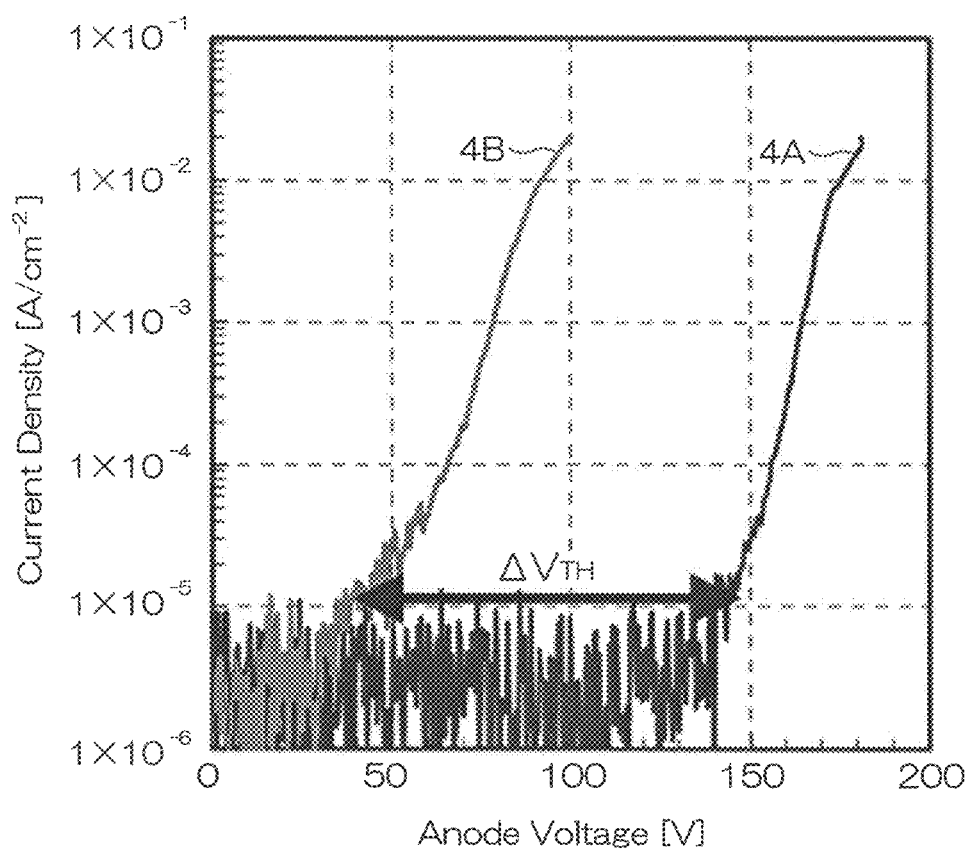

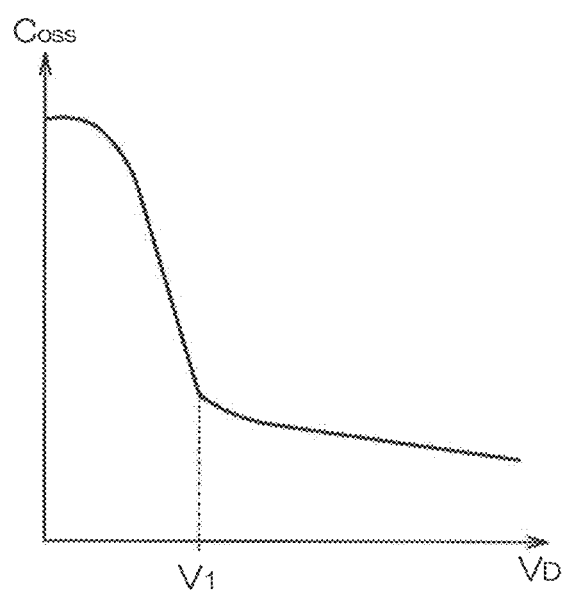

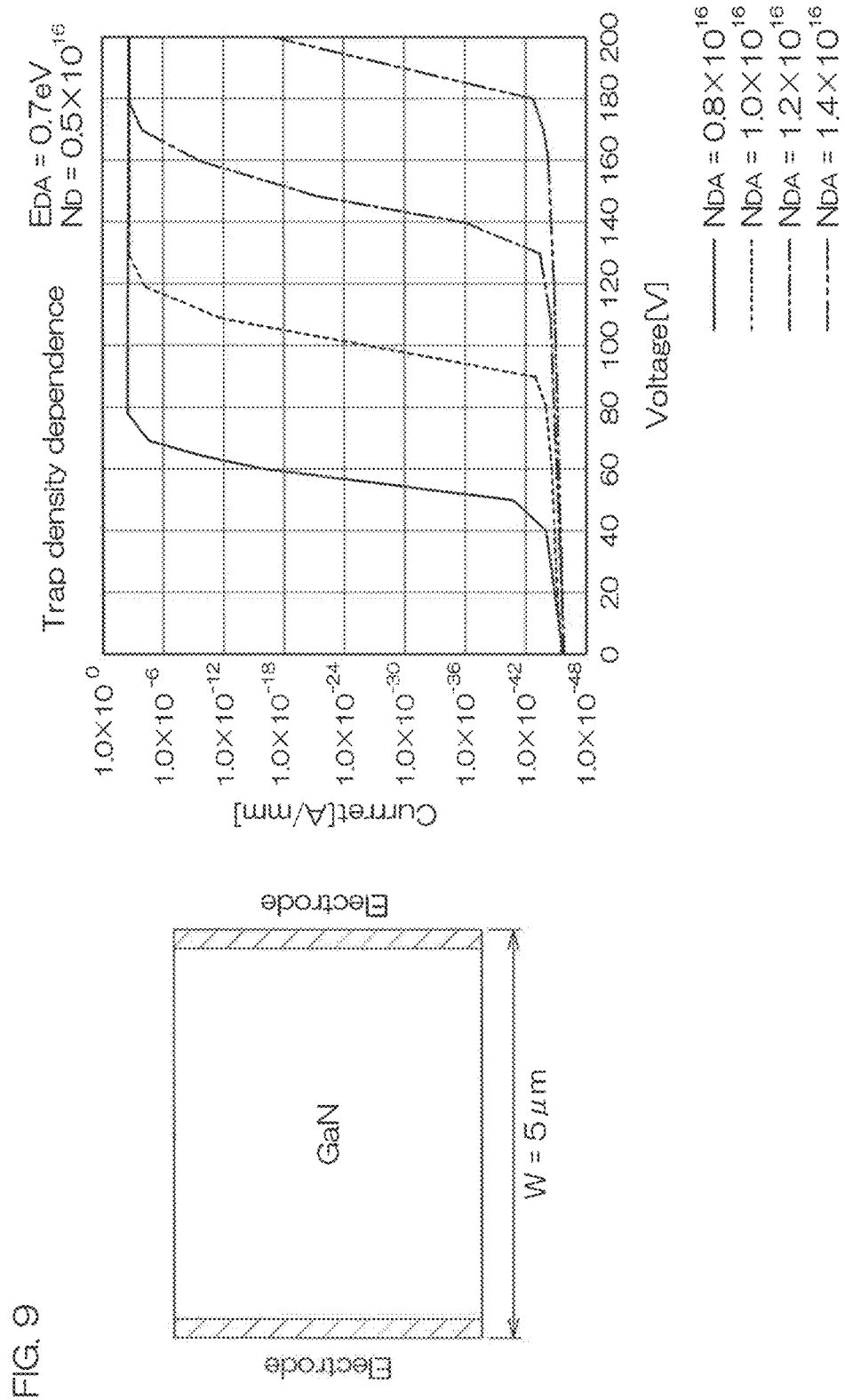

FIG. 10A  At time of no bias
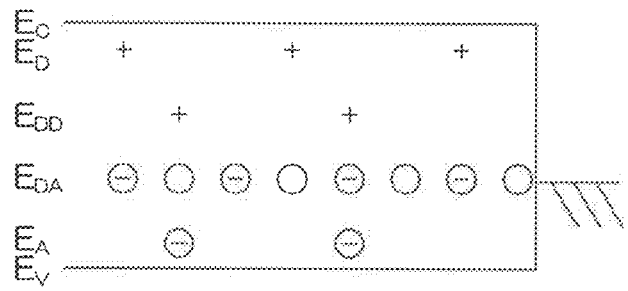
FIG. 10B  Bias application
(state where no current flows)
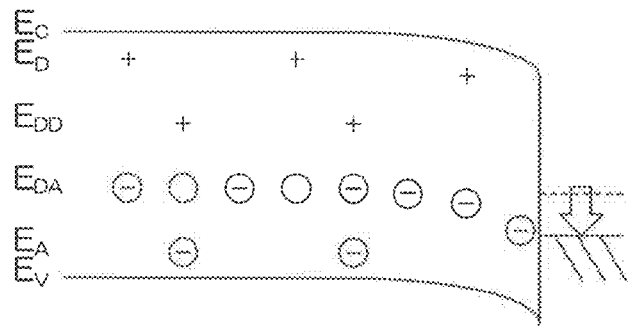
FIG. 10C  Bias application
(state where current starts to flow)
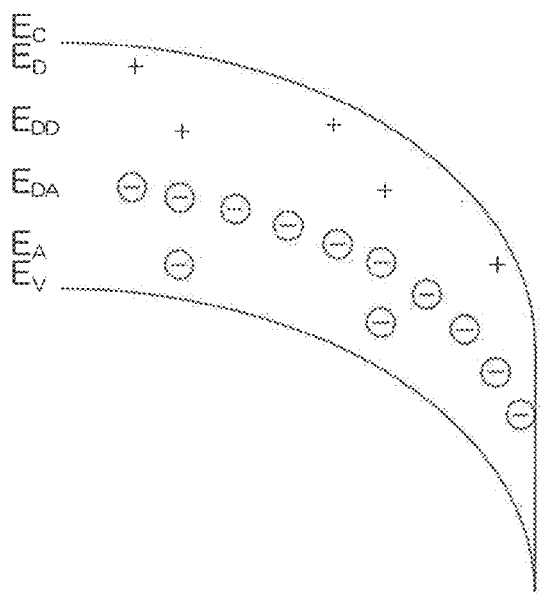

NITRIDE SEMICONDUCTOR DEVICE

CROSS-REFERENCE TO RELATED APPLICATIONS

This application corresponds to patent application No. 2015-88663 filed in the Japan Patent Office on Apr. 23, 2015 and patent application No. 2016-82382 filed in the Japan Patent Office on Apr. 15, 2016, and the entire disclosures of which are incorporated herein by reference.

TECHNICAL FIELD

The present invention relates to nitride semiconductor devices.

BACKGROUND ART

For example, Patent Document 1 (Japanese Patent No. 5064824) discloses a HEMT. The HEMT has a heterojunction structure which is formed by stacking, on a substrate, a low-temperature buffer layer formed of GaN, a buffer layer formed of GaN, an electron transit layer formed of GaN and an electron supply layer formed of AlGaN in this order. The HEMT has a source electrode, a gate electrode and a drain electrode on the electron supply layer.

In the HEMT, the electron supply layer has a band-gap energy larger than the electron transit layer, and a two-dimensional electron gas layer is formed under a heterojunction interface of the two layers. The two-dimensional electron gas layer is utilized as a carrier. Specifically, when the source electrode and the drain electrode are operated, electrons supplied to the electron transit layer travel at a high speed in the two-dimensional electron gas layer and are moved to the drain electrode. Here, a voltage applied to the gate electrode is controlled to change the thickness of a depletion layer under the gate electrode, and it is thus possible to control the electrons moved from the source electrode to the drain electrode, that is, a drain current.

SUMMARY OF INVENTION

In the HEMT described above, enhancement of a switching speed is constantly required. Although the gate length is shortened to facilitate an increase in the switching speed, since a leak current is more likely to flow under the gate, a withstand voltage is disadvantageously lowered. Hence, although in order to reduce the concentration of an electric field, a field plate may be provided on a nitride semiconductor layer, it is difficult to obtain a sufficient withstand voltage unless the field plate is placed under appropriate conditions.

In a preferred embodiment of the present invention, a nitride semiconductor device is provided which can enhance both a switching speed and a withstand voltage.

BRIEF DESCRIPTION OF DRAWINGS

FIG. 5 is a diagram for illustrating I-V characteristics of FIGS. 4A and 4B.

FIG. 6 is a graph showing a relationship between a drain voltage $V_D$ and an output capacity $C_{OSS}$.

FIG. 9 is a diagram for illustrating the dependence of a current on a trap concentration.

FIGS. 10A to 10C are energy band diagrams showing the movement of electrons over time until a current starts to flow.

DESCRIPTION OF EMBODIMENTS

Figure 1:
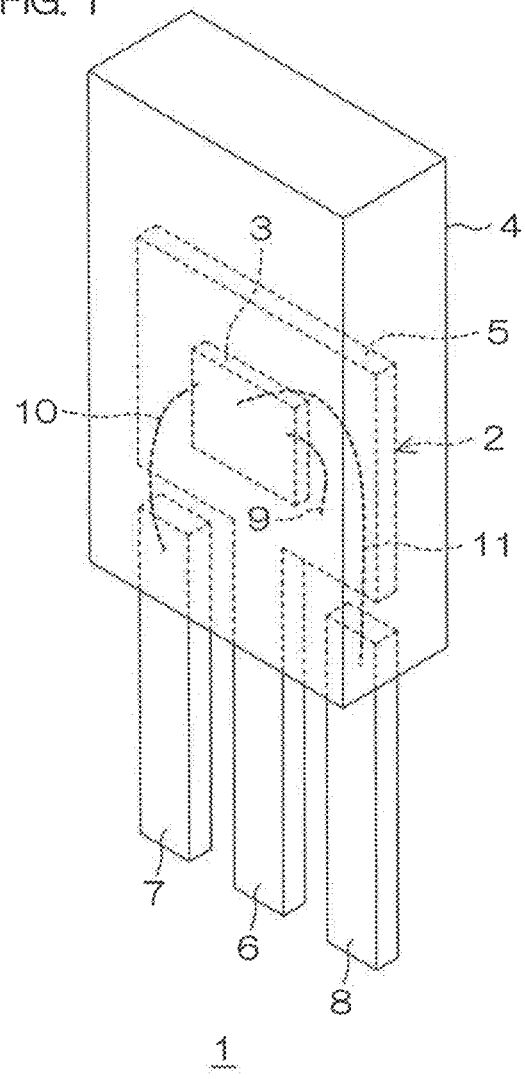
FIG. 1 is an external view of a semiconductor package which includes a nitride semiconductor device according to a preferred embodiment of the present invention.

In a preferred embodiment of the present invention, a nitride semiconductor device is provided which includes a nitride semiconductor layer having a gate, a source and a drain and a field plate on the nitride semiconductor layer electrically connected to the gate or the source and in which when it is assumed that a drain voltage value where the value of $C_{OSS}$ is reduced to one half of a value when a drain voltage is 0 V is $V_1$ (V), the dielectric breakdown voltage of the device is $V_2$ (V), a gate length is $L_g$ (cm), a field plate length is $L_{fp}$ (cm), a shallow acceptor concentration is $N_A$ (/cm$^3$), a deep acceptor concentration is $N_{DA}$ (/cm$^3$), a vacuum permittivity is $\in_0$ and the relative permittivity of the nitride semiconductor layer is $\in$, formulas (1) and (2) below are satisfied.

$$V_1 < q(N_A + N_{DA}) \cdot L_g^2 / 2\in_0\in \quad (1)$$

$$V_2 < q(N_A + N_{DA}) \cdot (L_g + L_{fp})^2 / 2\in_0\in \quad (2)$$

In this case, the nitride semiconductor device may satisfy formulas (3) and (4) below.

$$q(N_A + N_{DA}) \cdot L_g^2 / 2\in_0\in < 1.2 V_1 \quad (3)$$

$$q(N_A + N_{DA}) \cdot (L_g + L_{fp})^2 / 2\in_0\in < 1.2 V_2 \quad (4)$$

In a preferred embodiment of the present invention, a nitride semiconductor device is provided which includes a nitride semiconductor layer having a gate, a source and a drain and a field plate on the nitride semiconductor layer electrically connected to the gate or the source and in which when it is assumed that a drain voltage value where the value of $C_{OSS}$ is reduced to one half of a value when a drain voltage is 0 V is $V_1$ (V), the dielectric breakdown voltage of the device is $V_2$ (V), a gate length is $L_g$ (cm), a field plate length is $L_{fp}$ (cm), a shallow donor concentration is $N_D$ (/cm$^3$), a deep donor concentration is $N_{DD}$ (/cm$^3$), a shallow acceptor concentration is $N_A$ (/cm$^3$), a deep acceptor concentration is $N_{DA}$ (/cm$^3$), a vacuum permittivity is $\in_0$ and the relative permittivity of the nitride semiconductor layer is $\in$, formulas (5) and (6) below are satisfied.

$$V_1 < q(N_A + N_{DA} - N_D - N_{DD}) \cdot L_g^2 / 2\in_0\in \quad (5)$$

$$V_2 < q(N_A + N_{DA} - N_D - N_{DD}) \cdot (L_g + L_{fp})^2 / 2\in_0\in \quad (6)$$

In this case, the nitride semiconductor device may satisfy formulas (7) and (8) below.

$$q(N_A + N_{DA} - N_D - N_{DD}) \cdot L_g^2 / 2\in_0\in < 1.2 V_1 \quad (7)$$

$$q(N_A + N_{DA} - N_D - N_{DD}) \cdot (L_g + L_{fp})^2 / 2\in_0\in < 1.2 V_2 \quad (8)$$

In a preferred embodiment of the present invention, a nitride semiconductor device is provided which includes a nitride semiconductor layer having a gate, a source and a drain and a field plate on the nitride semiconductor layer electrically connected to the gate or the source and in which when it is assumed that a drain voltage value where the value of $C_{OSS}$ is reduced to one half of a value when a drain voltage is 0 V is $V_1$ (V), the maximum rated voltage of the device is $V_2$ (V), a gate length is $L_g$ (cm), a field plate length is $L_{fp}$ (cm), a shallow acceptor concentration is $N_A$ (/cm$^3$), a deep acceptor concentration is $N_{DA}$ (/cm$^3$), a vacuum permittivity is $\in_0$ and the relative permittivity of the nitride semiconductor layer is $\in$, formulas (1) and (2) below are satisfied.

$$V_1 < q(N_A + N_{DA}) \cdot L_g^2 / 2\in_0\in \quad (1)$$

$$V_2 < q(N_A + N_{DA}) \cdot (L_g + L_{fp})^2 / 2\in_0\in \quad (2)$$

In this case, the nitride semiconductor device may satisfy formulas (3) and (4) below.

$$q(N_A + N_{DA}) \cdot L_g^2 / 2\in_0\in < 1.2 V_1 \quad (3)$$

$$q(N_A + N_{DA}) \cdot (L_g + L_{fp})^2 / 2\in_0\in < 1.2 V_2 \quad (4)$$

In a preferred embodiment of the present invention, a nitride semiconductor device is provided which includes a nitride semiconductor layer having a gate, a source and a drain and a field plate on the nitride semiconductor layer electrically connected to the gate or the source and in which when it is assumed that a drain voltage value where the value of $C_{OSS}$ is reduced to one half of a value when a drain voltage is 0 V is $V_1$ (V), the maximum rated voltage of the device is $V_2$ (V), a gate length is $L_g$ (cm), a field plate length is $L_{fp}$ (cm), a shallow donor concentration is $N_D$ (/cm$^3$), a deep donor concentration is $N_{DD}$ (/cm$^3$), a shallow acceptor concentration is $N_A$ (/cm$^3$), a deep acceptor concentration is $N_{DA}$ (/cm$^3$), a vacuum permittivity is $\in_0$ and the relative permittivity of the nitride semiconductor layer is $\in$, formulas (5) and (6) below are satisfied.

$$V_1 < q(N_A + N_{DA} - N_D - N_{DD}) \cdot L_g^2 / 2\in_0\in \quad (5)$$

$$V_2 < q(N_A + N_{DA} - N_D - N_{DD}) \cdot (L_g + L_{fp})^2 / 2\in_0\in \quad (6)$$

In this case, the nitride semiconductor device may satisfy formulas (7) and (8) below.

$$q(N_A + N_{DA} - N_D - N_{DD}) \cdot L_g^2 / 2\in_0\in < 1.2 V_1 \quad (7)$$

$$q(N_A + N_{DA} - N_D - N_{DD}) \cdot (L_g + L_{fp})^2 / 2\in_0\in < 1.2 V_2 \quad (8)$$

In a preferred embodiment of the present invention, a nitride semiconductor device is provided which includes a nitride semiconductor layer having a gate, a source and a drain and a field plate on the nitride semiconductor layer electrically connected to the gate or the source and in which when it is assumed that a drain voltage value where the value of $C_{OSS}$ is reduced to one half of a value when a drain voltage is 0 V is $V_1$ (V), the sheet carrier density of a two-dimensional electron gas is $N_S$ (/cm$^2$), a gate length is $L_g$ (cm), a field plate length is $L_{fp}$ (cm), a shallow donor concentration is $N_D$ (/cm$^3$), a deep donor concentration is $N_{DD}$ (/cm$^3$), a shallow acceptor concentration is $N_A$ (/cm$^3$), a deep acceptor concentration is $N_{DA}$ (/cm$^3$), a vacuum permittivity is $\in_0$ and the relative permittivity of the nitride semiconductor layer is $\in$, formulas (5) and (9) below are satisfied.

$$V_1 < q(N_A + N_{DA} - N_D - N_{DD}) \cdot L_g^2 / 2\in_0\in \quad (5)$$

$$N_S^2 / (N_A + N_{DA} - N_D - N_{DD}) < (N_A + N_{DA} - N_D - N_{DD}) \cdot (L_g + L_{fp})^2 \quad (9)$$

In this case, the nitride semiconductor device may satisfy formulas (7) and (10) below.

$$q(N_A + N_{DA} - N_D - N_{DD}) \cdot L_g^2 / 2\in_0\in < 1.2 V_1 \quad (7)$$

$$(N_A + N_{DA} - N_D - N_{DD}) \cdot (L_g + L_{fp})^2 < 1.2 N_S^2 / (N_A + N_{DA} - N_D - N_{DD}) \quad (10)$$

In a preferred embodiment of the present invention, a nitride semiconductor device is provided which includes a nitride semiconductor layer having a gate, a source and a drain and a field plate on the nitride semiconductor layer electrically connected to the gate or the source and in which when it is assumed that a drain voltage value where the value of $C_{OSS}$ is reduced to one half of a value when a drain voltage is 0 V is $V_1$ (V), the sheet carrier density of a two-dimensional electron gas is $N_S$ (/cm$^2$), a gate length is $L_g$ (cm), a field plate length is $L_{fp}$ (cm), a shallow acceptor concentration is $N_A$ (/cm$^3$), a deep acceptor concentration is $N_{DA}$(/cm$^3$), a vacuum permittivity is $\in_0$ and the relative permittivity of the nitride semiconductor layer is $\in$, formulas (1) and (11) below are satisfied.

$$V_1 < q(N_A + N_{DA}) \cdot L_g^2 / 2 \in_0 \in \quad (1)$$

$$N_S^2 / (N_A + N_{DA}) < (N_A N_{DA}) \cdot (L_g + L_{fp})^2 \quad (11)$$

In this case, the nitride semiconductor device may satisfy formulas (3) and (12) below.

$$q(N_A + N_{DA}) \cdot L_g^2 / 2 \in_0 \in < 1.2 V_1 \quad (3)$$

$$(N_A + N_{DA}) \cdot (L_g + L_{fp})^2 < 1.2 N_S^2 / (N_A + N_{DA}) \quad (12)$$

In the preferred embodiment of the present invention, the gate length $L_g$ may be equal to or less than 0.5 μm, the field plate length $L_{fp}$ may be equal to or less than 0.5 μm and the maximum rated voltage of the device may be equal to or more than 50 V.

In the preferred embodiment of the present invention, the nitride semiconductor layer may be doped with at least one type of impurity selected from a group consisting of C, Be, Cd, Ca, Cu, Ag, Au, Sr, Ba, Li, Na, K, Sc, Zr, Fe, Co, Ni, Mg, Ar and He such that a deep acceptor level is formed.

In a preferred embodiment of the present invention, a nitride semiconductor device is provided which includes a nitride semiconductor layer which includes an electron transit layer and an electron supply layer that is in contact with the electron transit layer and that has a composition different from the electron transit layer, a gate, a source and a drain on the nitride semiconductor layer and a field plate on the nitride semiconductor layer electrically connected to the gate or the source and in which at least a part of the electron transit layer contains carbon, and the concentration of the carbon is $1 \times 10^{18}$ cm$^{-3}$ to $1 \times 10^{19}$ cm$^{-3}$.

In the preferred embodiment of the present invention, the electron transit layer may include a first region that forms an interface between the electron transit layer and the electron supply layer and a second region that is formed in a part 50 nm or more apart from the interface, and the carbon concentration of the second region may be $1 \times 10^{18}$ cm$^{-3}$ to $1 \times 10^{19}$ cm$^{-3}$, and the carbon concentration of the first region may be equal to or less than $1 \times 10^{17}$ cm$^3$.

In the preferred embodiment of the present invention, when it is assumed that a shallow donor concentration is $N_D$ (/cm$^3$), a deep donor concentration is $N_{DD}$ (/cm$^3$), a shallow acceptor concentration is $N_A$ (/cm$^3$) and a deep acceptor concentration is $N_{DA}$ (/cm$^3$), $N_A + N_{DA} - N_D - N_{DD}$ in the second region of the electron transit layer may be $4 \times 10^{16}$ cm$^{-3}$ to $8 \times 10^{16}$ cm$^{-3}$.

In a preferred embodiment of the present invention, a nitride semiconductor device is provided which includes: a nitride semiconductor layer which includes an electron transit layer and an electron supply layer that is in contact with the electron transit layer and that has a composition different from the electron transit layer; a gate, a source and a drain on the nitride semiconductor layer; and a field plate which is electrically connected to the gate or the source and which is arranged on the nitride semiconductor layer via an insulating film and in which a gate length $L_g$ is equal to or less than 0.6 μm, at least a part of the electron transit layer contains carbon, the concentration of the carbon is equal to or more than $1 \times 10^{18}$ cm$^{-3}$ and when it is assumed that the thickness of the insulating film under the field plate is d, and the relative permittivity of the insulating film is $\in$, d/$\in$≤14 is satisfied.

In the preferred embodiment of the present invention, in a case where when the gate is off, a voltage is applied between the source and the drain, as indicated in formulas (1) and (5) described above, a voltage (the right-hand side of each formula) when a region of the nitride semiconductor layer under the gate is punched through is higher than the voltage $V_1$ (the left-hand side of each formula) when the two-dimensional electron gas disappears. In this way, it is possible to prevent the punch-through under the gate, and it is thus possible to reduce the occurrence of a leak current when the gate is off.

As indicated in formulas (2), (6), (9) and (11) described above, a voltage (the right-hand side of each formula) when a region of the nitride semiconductor layer under the field plate is punched through is higher than the dielectric breakdown voltage $V_2$ or the maximum rated voltage $V_2$ of the device, and it is thus possible to realize a highly reliable device.

As is clear from each formula, the effect of the enhancement of the withstand voltage and the reliability described above can be realized by adjusting the values (such as the shallow acceptor concentration $N_A$ and the deep acceptor concentration $N_{DA}$) of the terms other than the gate length $L_g$ in each formula even if the gate length $L_g$ is reduced. Hence, the gate length $L_g$ is designed to be a desired length, and it is thus also possible to enhance the switching speed of the device while maintaining the withstand voltage.

Preferred embodiments of the present invention will be described in detail below with reference to accompanying drawings.

FIG. 1 is an external view of a semiconductor package 1 which includes a nitride semiconductor device 3 according to a preferred embodiment of the present invention.

The semiconductor package 1 includes a terminal frame 2, the nitride semiconductor device 3 (chip) and a resin package 4.

The terminal frame 2 is made of a metal and is formed in the shape of a plate. The terminal frame 2 includes a base portion 5 (island) which supports the nitride semiconductor device 3, a drain terminal 6, a source terminal 7 and a gate terminal 8. The drain terminal 6 is formed integrally with the base portion 5. The drain terminal 6, the source terminal 7 and the gate terminal 8 are respectively electrically connected to the drain, the source and the gate of the nitride semiconductor device 3 via bonding wires 9 to 11. The source terminal 7 and the gate terminal 8 are arranged so as to sandwich the drain terminal 6 in the center.

The resin package 4 is formed of, for example, a known mold resin such as an epoxy resin, and seals the nitride semiconductor device 3. The resin package 4 covers the base portion 5 of the terminal frame 2 and the bonding wires 9 to 11 together with the nitride semiconductor device 3. Parts of the three terminals 6 to 8 are exposed from the resin package 4.

Figure 2:
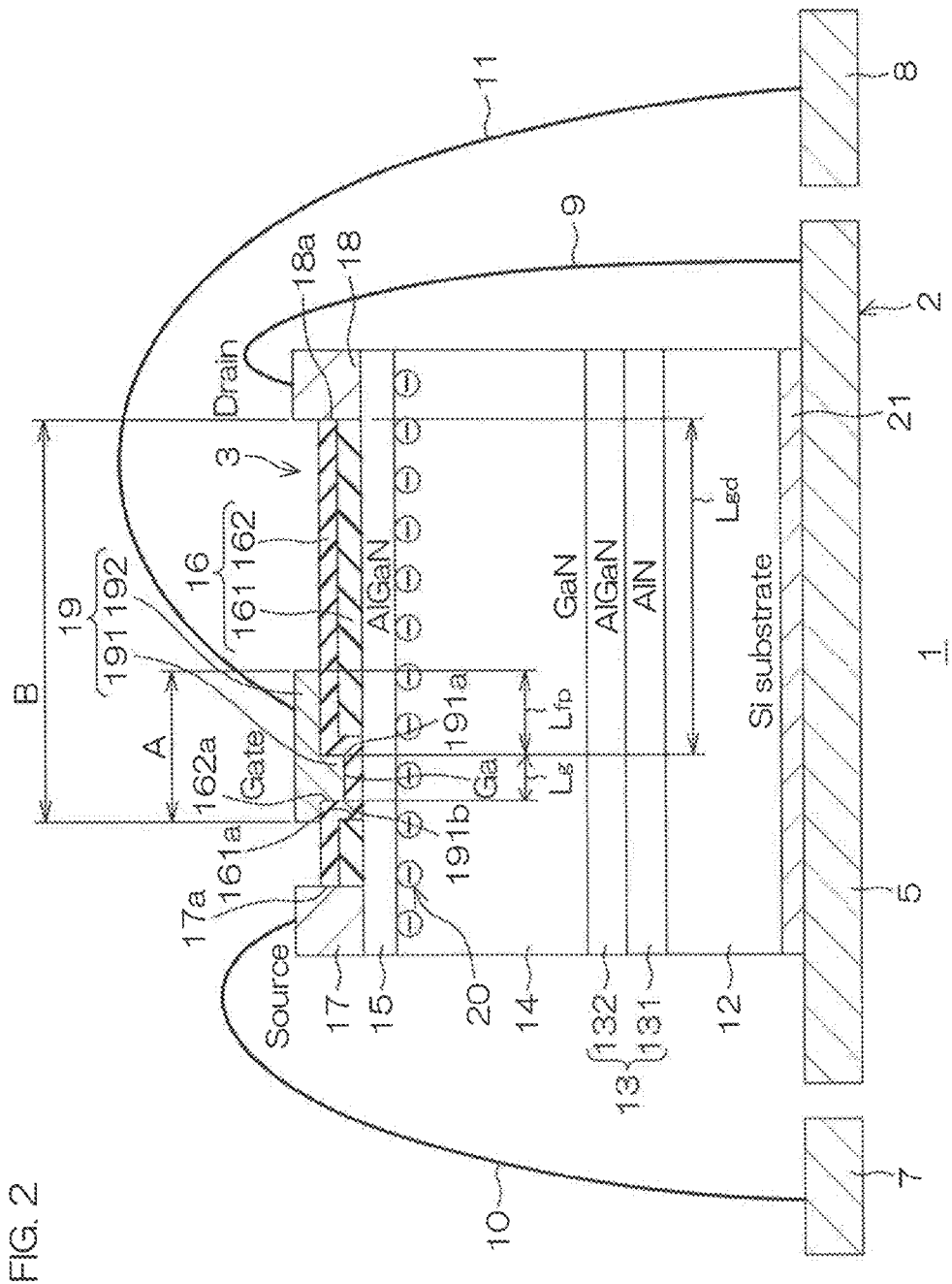
FIG. 2 is a schematic cross-sectional view of the nitride semiconductor device.

FIG. 2 is a schematic cross-sectional view of the nitride semiconductor device 3. FIG. 2 does not show a cross section taken in a specific position of FIG. 1 but shows a cross section of a collection of elements necessary for the description of the present preferred embodiment.

The nitride semiconductor device 3 includes a substrate 12, a buffer layer 13 which is formed on the surface of the substrate 12, an electron transit layer 14 which is epitaxially grown on the buffer layer 13 and an electron supply layer 15 which is epitaxially grown on the electron transit layer 14. The nitride semiconductor device 3 further includes a gate insulating film 16 which covers the surface of the electron supply layer 15 and a source electrode 17 and a drain electrode 18 which penetrate contact holes 17a and 18a formed in the gate insulating film 16 to make ohmic contact with the electron supply layer 15 and which serve as ohmic electrodes. The source electrode 17 and the drain electrode 18 are arranged with an interval, and a gate electrode 19 is arranged between them. The gate electrode 19 is opposite to the electron supply layer 15 via the gate insulating film 16.

The substrate 12 may be, for example, a conductive silicon substrate. The conductive silicon substrate may have, for example, an impurity concentration of $1 \times 10^{17}$ cm$^{-3}$ to $1 \times 10^{20}$ cm$^{-3}$ (more specifically, $1 \times 10^{18}$ cm$^{-3}$).

The buffer layer 13 may be a multilayer buffer layer in which a first buffer layer 131 and a second buffer layer 132 are stacked. The first buffer layer 131 is in contact with the surface of the substrate 12, and the second buffer layer 132 is stacked on the surface of the first buffer layer 131 (the surface on the opposite side of the substrate 12). In the present preferred embodiment, the first buffer layer 131 is formed with an AlN film, and the thickness of the film may be, for example, about 0.2 μm. In the present preferred embodiment, the second buffer layer 132 is formed with an AlGaN film, and the thickness of the film may be, for example, about 0.2 μm.

The gate insulating film 16 may be a multilayer gate insulating film in which a first insulating layer 161 and a second insulating layer 162 are stacked. The first insulating layer 161 is in contact with the surface of the electron supply layer 15, and the second insulating layer 162 is stacked on the surface of the first insulating layer 161 (the surface on the opposite side of the electron supply layer 15). In the present preferred embodiment, the first insulating layer 161 is formed with an SiN film, and the thickness of the film may be, for example, about 500 angstroms. The first insulating layer 161 described above can be formed by a plasma CVD (chemical vapor deposition) method, a thermal CVD method, sputtering or the like. In the first insulating layer 161, an opening 161a is formed so that the second insulating layer 162 is made to enter so as to make contact with the electron supply layer 15. In the present preferred embodiment, the second insulating layer 162 is formed of alumina ($Al_aO_b$), and the thickness of the film may be, for example, about 300 angstroms. The second insulating layer 162 has a concave portion 162a in a part of the first insulating layer 161 which enters the opening 161a. The second insulating layer 162 described above can be formed by accurately controlling the thickness of the film such as by an ALD method.

When an alumina film is formed by the ALD method, in general, a variation in the composition ratio of a:b between Al and O is produced, and not all is formed into $Al_2O_3$. This is because the ALD method is a process of a relatively low temperature. However, even if in an insulator formed of Al and O, its composition is not strictly controlled, an insulating layer having a high band-gap and a high withstand voltage can be formed. In the present specification, the composition is referred to as "alumina" which includes cases where the composition ratio of a:b between Al and O is not 2:3.

The electron transit layer 14 and the electron supply layer 15 are formed of group-III nitride semiconductors having different Al compositions (hereinafter simply referred to as "nitride semiconductors"). For example, the electron transit layer 14 may be formed with a GaN layer, and the thickness thereof may be about 0.5 μm. In the present preferred embodiment, the electron supply layer 15 is formed with an $Al_xGa_{1-x}N$ layer (0<x<1), and the thickness thereof is, for example, 5 to 30 nm (more specifically, about 20 nm).

As described above, the electron transit layer 14 and the electron supply layer 15 are formed of nitride semiconductors having different Al compositions to form a heterojunction, and a lattice mismatch occurs therebetween. Then, due to polarization caused by the heterojunction and the lattice mismatch, in a position close to an interface between the electron transit layer 14 and the electron supply layer 15 (for example, a position of a distance of about a few angstroms from the interface), a two-dimensional electron gas 20 is spread.

In the electron transit layer 14, with respect to the energy band structure thereof, a shallow donor level $E_D$, a deep donor level $E_{DD}$, a shallow acceptor level $E_A$ and a deep acceptor level $E_{DA}$ may be formed.

The shallow donor level $E_D$ is, for example, an energy level in a position 0.025 eV or less away from an energy level $E_C$ of the lower end (bottom) of the conduction band of the electron transit layer 14, and may be simply referred to as a "donor level $E_D$" when it is possible to distinguish it from the deep donor level $E_{DD}$. In general, donor electrons with which this position is doped are free electrons even at room temperature (thermal energy kT=about 0.025 eV) because they are excited by the conduction band. As an impurity which dopes the GaN electron transit layer 14 to form the shallow donor level $E_D$, for example, at least one type selected from a group consisting of Si and O is present. On the other hand, the deep donor level $E_{DD}$ is, for example, an energy level in a position 0.025 eV or more away from the energy level $E_C$ of the lower end (bottom) of the conduction band of the electron transit layer 14. In other words, the deep donor level $E_{DD}$ is formed by doping with a donor in which ionization energy necessary for excitation is higher than thermal energy at room temperature. Hence, in general, donor electrons with which this position is doped are not excited by the conduction band at room temperature and are captured by the donor.

The shallow acceptor level $E_A$ is, for example, an energy level in a position 0.025 eV or less away from an energy level $E_V$ of the upper end (top) of the valence electron of the electron transit layer 14, and may be simply referred to as an "acceptor level $E_A$" when it is possible to distinguish it from the deep acceptor level $E_{DA}$. In general, acceptor holes with which this position is doped are free holes even at room temperature (thermal energy kT=about 0.025 eV) because they are excited by the valence band. On the other hand, the deep acceptor level $E_{DA}$ is, for example, an energy level in a position 0.025 eV or more away from the energy level $E_V$ of the upper end (top) of the valence electron of the electron transit layer 14. In other words, the deep acceptor level $E_{DA}$ is formed by doping with an acceptor in which ionization energy necessary for excitation is higher than thermal energy at room temperature. Hence, in general, acceptor holes with which this position is doped are not excited by the valence band at room temperature and are captured by the acceptor. Although at room temperature, as an impurity which generates holes, Mg is known, its activation rate (ratio of generated holes to the amount of doping) is 1/10 or less, and thus Mg can be interpreted as a shallow acceptor or a deep acceptor but in the present invention, since $N_A+N_{DA}$ is an important value, Mg may be interpreted as either of them. Examples of an impurity which dopes the electron transit layer 14 made of GaN so as to form the deep acceptor level $E_{DA}$ include at least one type selected from a group consisting of, for example, C, Be, Cd, Ca, Cu, Ag, Au, Sr, Ba, Li, Na, K, Sc, Zr, Fe, Co, Ni, Mg, Ar and He.

In the present preferred embodiment, the concentrations of impurities (dopants) which form the shallow donor level $E_D$, the deep donor level $E_{DD}$, the shallow acceptor level $E_A$ and the deep acceptor level $E_{DA}$ described above are respectively referred to as a shallow donor concentration $N_D$, a deep donor concentration $N_{DD}$, a shallow acceptor concentration $N_A$ and a deep acceptor concentration $N_{DA}$.

The impurity concentration of the electron transit layer 14 as a whole preferably satisfies $N_A+N_{DA}-N_D-N_{DD}>0$. The inequality means that as compared with the total sum ($N_D+N_{DD}$, hereinafter the total sum may also be referred to as a donor concentration $N_d$) of the impurity concentrations of donor atoms which can discharge electrons, the total sum ($N_A+N_{DA}$, hereinafter the total sum may also be referred to as a trap concentration $N_t$) of the impurity concentrations of acceptor atoms which can capture the discharged electrons is large. In other words, since in the electron transit layer 14, almost all of the electrons discharged from the shallow donor atoms and the deep donor atoms are not excited by the conduction band and are captured by the shallow acceptor atoms or the deep acceptor atoms, the electron transit layer 14 is formed of a semi-insulating i-type GaN.

However, even when the layer is doped with at least one type of impurity selected from a group consisting of C, Be, Cd, Ca, Cu, Ag, Au, Sr, Ba, Li, Na, K, Sc, Zr, Fe, Co, Ni, Mg, Ar and He, not all of the impurity functions as the deep acceptor, and for example, in the case of C (carbon), the impurity functions as the deep acceptor by being replaced into an N (nitrogen) site in a Group III nitride semiconductor crystal whereas the impurity functions as the shallow donor by being replaced into a Group III element site. The proportions of the replacements into the individual sites depend on the concentration of the carbon with which the layer is doped. The layer is doped with the impurity, and a crystal defect is thus produced but it is not clear which one of the shallow donor, the deep donor, the shallow acceptor and the deep acceptor the crystal defect functions as. Hence, it is impossible to find the value of $N_A+N_{DA}-N_D-N_{DD}$ with the measurement of the impurity concentration by SIMs (Secondary Ion Mass Spectrometry).

Figure 3A:
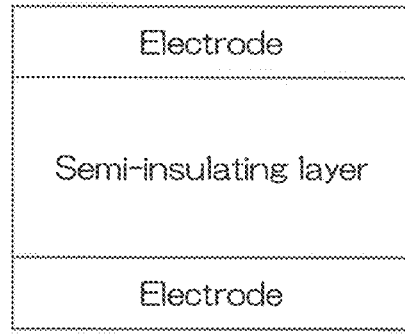
FIGS. 3A to 3C are diagrams for illustrating how to measure a value of $N_A+N_{DA}-N_D-N_{DD}$.

It is found that the measurement of the value of $N_A+N_{DA}-N_D-N_{DD}$ can be performed by measurement of a leak current in the longitudinal direction of a semi-insulating layer as shown in FIG. 3A. As described above, the electron transit layer is the semi-insulating layer in which the electrons discharged from the shallow donor and the deep donor are captured by the shallow acceptor and the deep acceptor. As shown in FIG. 10A, these layers are in a state in which without any bias, a deep acceptor level where no electron is captured is present and an empty deep acceptor is present. Here, the GaN layer is electrically neutral. As shown in FIG. 10B, since under an external voltage of a certain value or less, an electron is captured by the deep acceptor which captures no electron without any bias, and the positive bias side is thus negatively charged to cancel out the electric field, an extremely small current flows. Here, a region of the semi-insulating layer on the positive bias side is negatively charged, and the charge density thereof is $N_A+N_{DA}-N_D-N_{DD}$. When a voltage of a certain value or more is applied, electrons are captured by all the deep acceptor levels, the electric field cannot be cancelled out anymore and the current starts to be increased. Here, all the regions of the semi-insulating layer are negatively charged, and the charge density thereof is $N_A+N_{DA}-N_D-N_{DD}$. Hence, when the distribution of $N_A+N_{DA}-N_D-N_{DD}$ in the semi-insulating layer is uniform, and it is assumed that an elementary charge amount is q, the thickness of the semi-insulating layer is d and a voltage when the current starts to be increased is $V_{TH}$, Poisson's equation is used, and it is thus possible to determine $N_A+N_{DA}-N_D-N_{DD}$ by the formula of $N_A+N_{DA}-N_D-N_{DD}=2\in\in_0 V_{TH}/qd^2$.

Figure 3B:
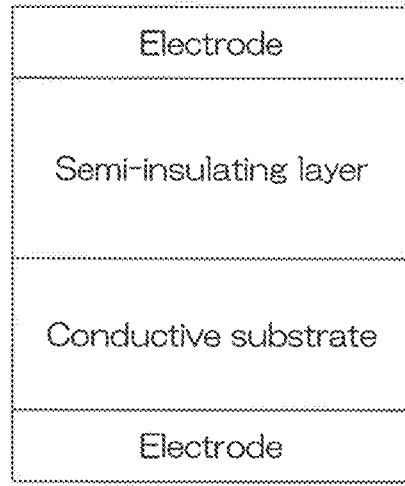
Figure 3C:
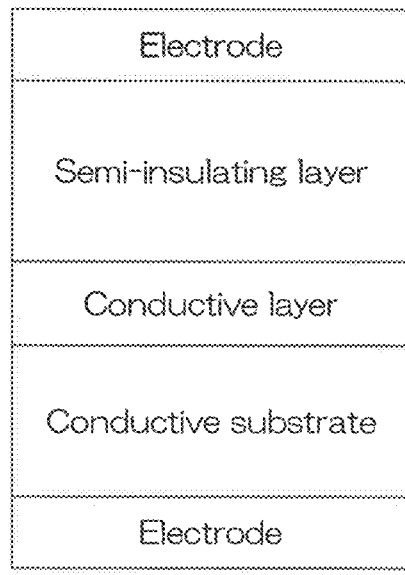

In the measurement, as shown in FIGS. 3B and 3C, in the semi-insulating layer, electrodes may be formed through a conductive layer and a conductive substrate.

Figure 4A:
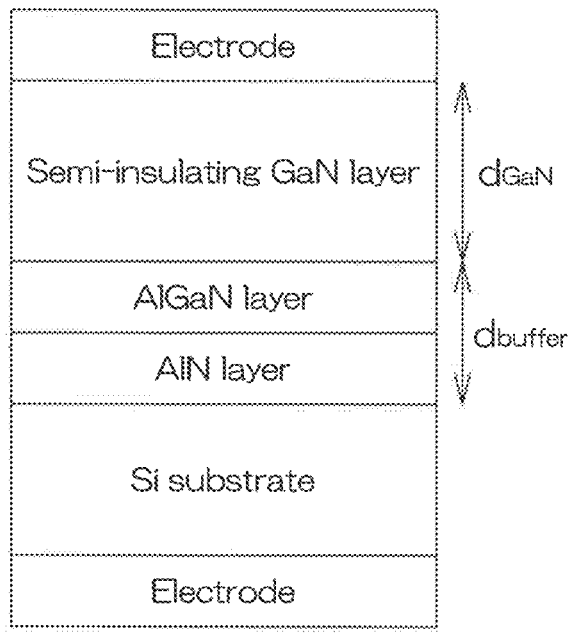
FIGS. 4A and 4B are diagrams for illustrating how to measure a value of $N_A N_{DA}-N_D-N_{DD}$ in a semi-insulating GaN layer.
Figure 4B:
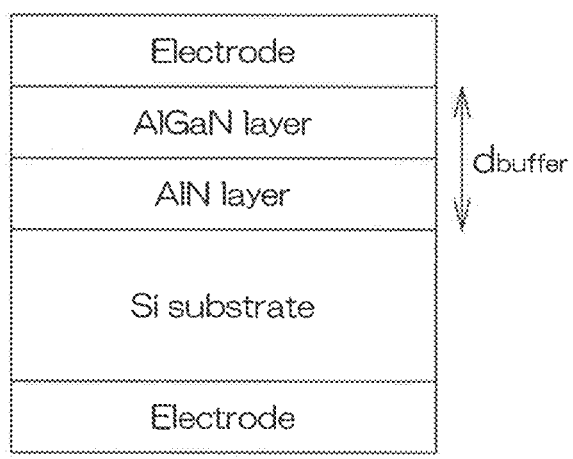

When GaN is grown on different types of substrates, it is necessary to introduce a buffer layer between the GaN and the substrate. For example, in the case of a semi-insulating GaN on a Si substrate, between the conductive substrate and the semi-insulating GaN layer which is a measurement target, a semi-insulating buffer layer formed with the stacked layers of AlN and AlGaN is included. Since it is expected that these buffer layers have $N_A+N_{DA}-N_D-N_{DD}$ which differs from the semi-insulating GaN layer, in order for $N_A+N_{DA}-N_D-N_{DD}$ of the semi-insulating GaN layer to be measured, as shown in FIGS. 4A and 4B, a sample grown to the buffer layer and a sample grown to the semi-insulating GaN layer are prepared, and a positive bias is applied to the electrode on the substrate. When it is assumed that in each sample, the difference of $V_{TH}$ of each sample is $\Delta V_{TH}$, the thickness of the semi-insulating GaN layer is $d_{GaN}$ and the thickness of the buffer layer is $d_{buffer}$, it is possible to determine $N_A+N_{DA}-N_D-N_{DD}$ by the formula of $N_A+N_{DA}-N_D-N_{DD}=2\in\in_0\Delta V_{TH}/q\,(d_{GaN}^2+2d_{GaN}d_{buffer})$.

For example, when the thickness of the semi-insulating GaN layer which is grown under certain conditions is 1.5 μm, and the thickness of the buffer layer is 0.2 μm, the I-V characteristic shown in FIG. 5 is obtained, and $N_A+N_{DA}-N_D-N_{DD}$ of the semi-insulating GaN layer can be determined to be $3.2\times10^{16}/cm^3$.

The electron supply layer 15 may have, in the interface with the electron transit layer 14, an AlN layer which has about a thickness of a few atoms (equal to or less than 5 nm, preferably 1 to 5 nm and more preferably 1 to 3 nm). The AlN layer described above reduces the scattering of electrons and facilitates the enhancement of electron mobility.

The gate electrode 19 may be formed with a multilayer electrode film which has a lower layer in contact with the gate insulating film 16 and an upper layer stacked on the lower layer. The lower layer may be formed of Ni, Pt, Mo, W or TiN, and the upper layer may be formed of Au or Al. The gate electrode 19 is arranged so as to be displaced to the source electrode 17, and thereby has an asymmetric structure in which the distance between the gate and the drain is longer than the distance between the gate and the source. The asymmetric structure alleviates a high electric field produced between the gate and the drain to facilitate the enhancement of the withstand voltage.

The gate electrode 19 includes a gate main body portion 191 which is formed in the second insulating layer 162 between the source electrode 17 and the drain electrode 18 and which enters the concave portion 162a and a field plate portion 192 which is continuous to the gate main body portion 191 and which is extended on the gate insulating film 16 outside the opening 161a toward the drain electrode 18. A distance $L_{fp}$ from a drain end 191a which is an end portion on the side of the drain electrode 18 in the interface between the gate main body portion 191 and the second insulating layer 162 to an end portion of a field plate portion 192 on the side of the drain electrode 18 is referred to as a field plate length. On the other hand, a distance $L_g$ from the drain end 191a in the interface between the gate main body portion 191 and the second insulating layer 162 to a source end 191b which is an end portion on the side of the source electrode 17 is referred to as a gate length. In other words, the width of an effective gate area (region within the concave portion 162a) which is a contact area between the gate electrode 19 and the bottom surface of the concave portion 162a of the second insulating layer 162 is referred to as the gate length. Furthermore, in the present specification, a distance between the gate main body portion 191 and the drain electrode 18 is represented by $L_{gd}$.

The field plate length $L_{fp}$ is preferably equal to or more than one tenth but equal to or less than one half of the distance $L_{gd}$ between the gate and the drain. Specifically, it may be equal to or more than 0.1 μm but equal to or less than 0.5 μm. On the other hand, the gate length $L_g$ is preferably equal to or more than 0.1 μm but equal to or less than 1.0 μm. Specifically, it may be equal to or more than 0.2 μm but equal to or less than 0.5 μm.

The source electrode 17 and the drain electrode 18 are, for example, ohmic electrodes which include Ti and Al, and are electrically connected via the electron supply layer 15 to the two-dimensional electron gas 20.

The bonding wires 9 to 11 shown in FIG. 1 are connected to the drain electrode 18, the source electrode 17 and the gate electrode 19, respectively. On the back surface of the substrate 12, a back surface electrode 21 is formed, and the substrate 12 is connected via the back surface electrode 21 to the base portion 5. Hence, in the present preferred embodiment, the substrate 12 is electrically connected via the bonding wire 9 to the drain electrode 18 so as to have a drain potential.

In the nitride semiconductor device 3, on the electron transit layer 14, the electron supply layer 15 having a different Al composition is formed so as to form a hetero junction. In this way, within the electron transit layer 14 in the vicinity of the interface between the electron transit layer 14 and the electron supply layer 15, the two-dimensional electron gas 20 is formed, and a HEMT which utilizes the two-dimensional electron gas 20 as a channel is formed. The gate electrode 19 is opposite to the electron supply layer 15 through the gate insulating film 16. An appropriate negative voltage is applied to the gate electrode 19, and thus the channel formed with the two-dimensional electron gas 20 can be interrupted. Hence, a control voltage is applied to the gate electrode 19, and it is thus possible to turn on and off the region between the source and the drain.

In use, for example, between the source electrode 17 and the drain electrode 18, a predetermined voltage (for example, 200 to 600 V) in which the side of the drain electrode 18 is positive is applied. In this state, an off-voltage (for example, −5 V) or an on-voltage (for example, 0 V) is applied to the gate electrode 19 under the assumption that the source electrode 17 has a reference potential (0 V).

In order to enhance the withstand voltage in the nitride semiconductor device 3 which is operated as described above, the nitride semiconductor device 3 satisfies formula (1) or (5) below.

$$V_1 < q(N_A + N_{DA}) \cdot L_g^2 / 2\epsilon_0 \epsilon \quad (1)$$

$$V_1 < q(N_A + N_{DA} - N_D - N_{DD}) \cdot L_g^2 / 2\epsilon_0 \epsilon \quad (5)$$

In formulas (1) and (5) described above, $\epsilon_0$ is a vacuum permittivity, and $\epsilon$ is the relative permittivity of the electron transit layer 14 (GaN). $V_1$ on the left-hand side of each of formulas (1) and (5) represents a voltage when the electron transit layer 14 under the field plate portion 192 is depleted and in such a region, the two-dimensional electron gas 20 is depleted. On the other hand, the right-hand side of each of formulas (1) and (5) represents a voltage when punch-through occurs under the gate and thus a leak current starts to flow. In other words, the inequalities represented by formulas (1) and (5) indicate that no punch-through occurs under the gate until the electron transit layer 14 is depleted under the field plate portion 192 and it is thus possible to reduce the leak current under the gate. Next, a description will be given of how to determine the left-hand side and the right-hand side of formulas (1) and (5).

First, with respect to the right-hand side of formulas (1) and (5), $V_1$ represents a drain voltage value where the value of $C_{OSS}$ is reduced to one half of a value when a drain voltage is 0 V, and when a relationship between the drain voltage $V_D$ and the output capacity $C_{OSS}$ of the device is shown in a graph, $V_1$ is the drain voltage $V_1$ shown in FIG. 6. This voltage $V_1$ is defined as a voltage when the electron transit layer 14 under the field plate portion 192 is depleted and in such a region, the two-dimensional electron gas 20 disappears.

Figure 7:
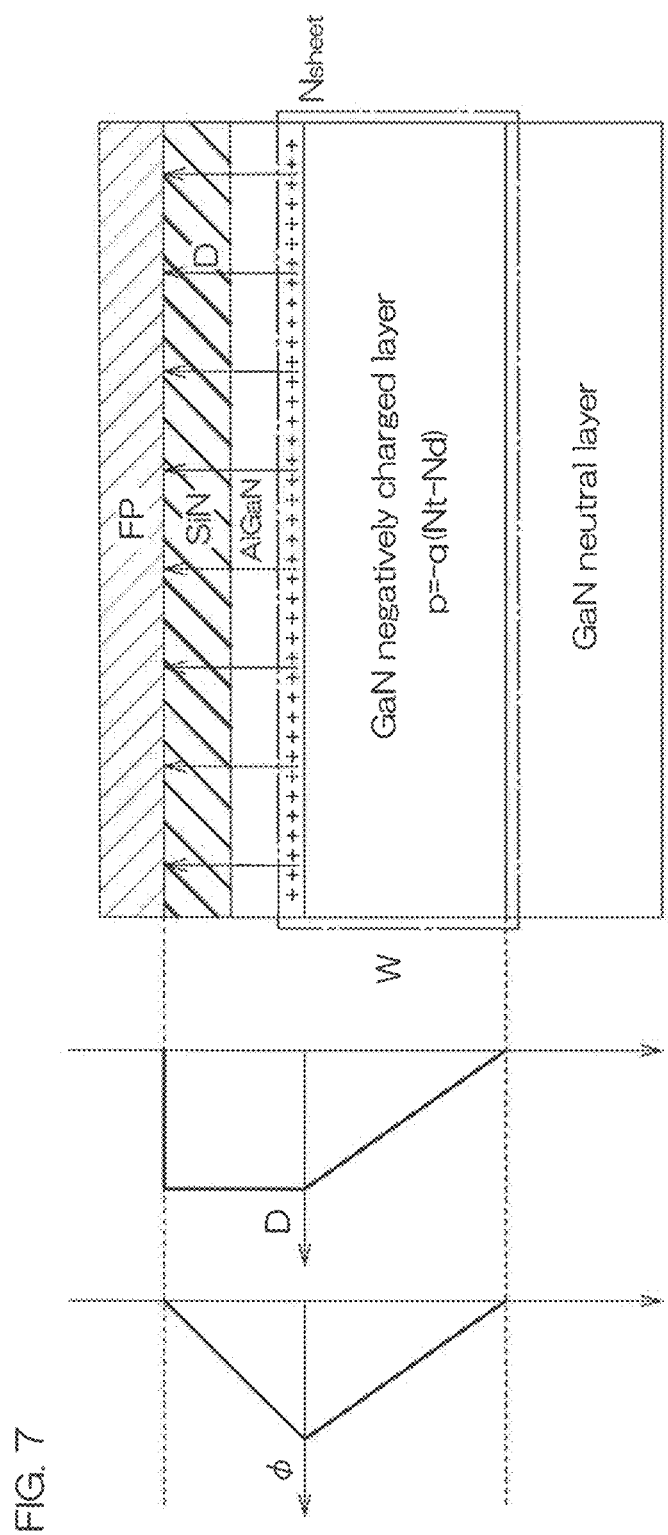
FIG. 7 is a diagram for illustrating how to determine a depletion voltage of a two-dimensional electron gas under a field plate.

For example, as shown in the diagram on the right in FIG. 7, as an appropriate negative voltage is applied to the gate electrode, under the field plate (FP) connected to the gate electrode, the two-dimensional electron gas is depleted, and polarization occurs between a GaN negatively charged layer (part of the electron transit layer 14 in the present preferred embodiment) and an AlGaN layer (the electron supply layer 15 in the present preferred embodiment) thereon. Here, an electric flux is produced in an upward direction toward the field plate FP from the AlGaN layer. An electric flux density D is, based on Gauss's theorem (divD=ρ), equal to the total sum of charges within the GaN negatively charged layer which is a closed space opposite to the AlGaN layer. When it is assumed that the thickness of the GaN negatively charged layer is W and that the sheet carrier density of the two-dimensional electron gas in the GaN negatively charged layer is $N_S$, $D = q\{N_S - W(N_t - N_d)\}$ is derived. Then, $D = \epsilon E$ ($\epsilon$ is the relative permittivity of GaN) and $V_1 = \int E dz$ (z is the direction of the thickness of the GaN negatively charged layer) hold true, and consequently, $V_1 = \int q\{N_S - W(N_t - N_d)\}/\epsilon dz$ can be obtained. A value set for each device is substituted into $V_1 = \int q\{N_S - W(N_t - N_d)\}/\epsilon dz$, calculation is performed and it is thus possible to determine a depletion voltage $V_1$ of the two-dimensional electron gas under the field plate FP. The depletion voltage $V_1$ is preferably lowered because it is easily depleted, and in order to do so, for example, an insulating film (in the present preferred embodiment, the gate insulating film 16) under the field plate is preferably reduced in thickness or the insulating film is preferably formed with a material having a high dielectric constant. The diagram on the left in FIG. 7 individually shows the distribution of a potential Φ when the two-dimensional electron gas is depleted and the distribution of the electric flux density D.

Figure 8:
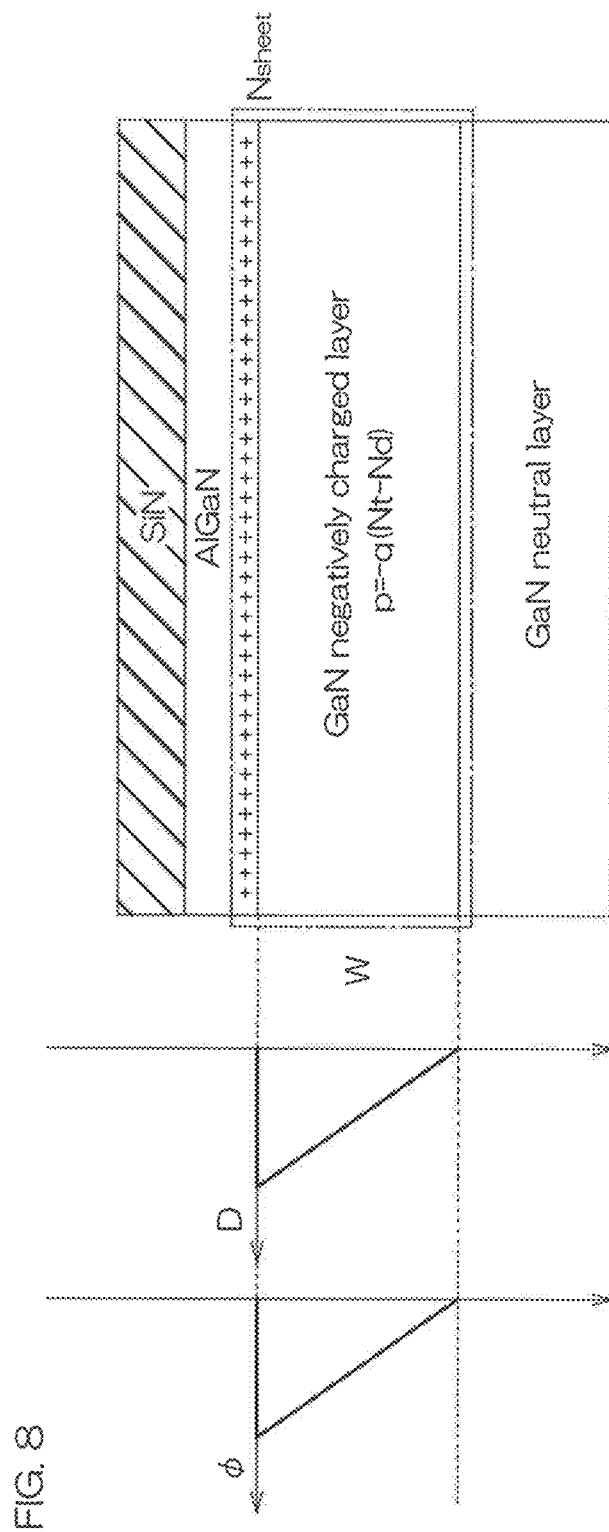
FIG. 8 is a diagram for illustrating how to determine a depletion voltage of the two-dimensional electron gas in a region from an end of the field plate to a drain.

As reference, a description will be given of how to determine a depletion voltage $V_3$ of the two-dimensional electron gas from the end portion of the field plate portion 192 on the side of the drain electrode 18 to the drain electrode 18 with reference to FIG. 8. In the same manner as in the case of FIG. 7, for example, though in a state where the GaN negatively charged layer is depleted, charges of $q\{N_S - W(N_t - N_D)\}$ are present within the GaN negatively charged layer which is a closed space, since in such a region, the field plate FP is not provided above the GaN negatively charged layer, an electric flux is not produced in the upward direction from the AlGaN layer. Hence, $D = q\{N_S - W(N_t - N_d)\} = 0$ holds true, and from this formula, $W = N_S/(N_t - N_d)$ is derived. Then, the depletion voltage $V_3$ in such a region is derived from Poisson's equation into $V_3 = q(N_t - N_d)W^2/2\epsilon$. Since $W = N_S/(N_t - N_d)$, the depletion voltage $V_3$ can be specified by the trap concentration $N_t$ and the donor concentration $N_d$ regardless of the thickness W of the GaN negatively charged layer.

A description will then be given of the right-hand side of formulas (1) and (5) with reference to FIGS. 9 and 10A to 10C. As shown in FIG. 9, as a sample configuration for simulation, a GaN layer is set such that its thickness W=5 μm, a shallow donor concentration $N_D$=0.5×10$^{16}$ cm$^{-3}$ and a deep acceptor level $E_{DA}$=0.7 eV. Then, how the rising edge of a current is affected by the deep acceptor concentration $N_{DA}$ as a voltage (bias) between both electrodes on the front and back surfaces of the GaN layer is increased is verified. Then, as is clear from the graph of FIG. 9, the graph can be obtained in which a rising voltage is different but substantially the same waveform is formed. In other words, it is found from FIG. 9 that the voltage when a current starts to flow in GaN depends on the trap concentration (in this simulation, the deep acceptor concentration $N_{DA}$).

In more specific illustration, first, as shown in FIG. 10A, when no voltage is applied between both electrodes (at the time of no bias, the acceptor and the deep acceptor capture electrons discharged by the donor and the deep donors. Here, since the number of positive charges caused by the donor discharging electrons and the deep donor is equal to the number of negative charges caused by the acceptor capturing electrons and the deep acceptor, the GaN layer as a whole is electrically neutral. Next, as shown in FIG. 10B, as a voltage is applied, on a positive bias side, electrons are captured from the valence band ($E_V$) by the deep acceptor, with the result that negative charging is performed. Since an electric flux generated by the application of the voltage is cancelled out by the negatively charged region, an extremely small amount of current flows. Then, as shown in FIG. 10C, when a certain amount or more of voltage is applied, electrons are captured by the deep acceptor in all the regions. Even when a voltage exceeding this voltage is applied, no electrons are captured, and the flux is not sufficiently cancelled out, with the result that a current starts to flow. A formula which includes the voltage V at this time is derived from Poisson's equation into $N_A+N_{DA}-N_D-N_{DD}$=2V∈$_0$∈/qW$^2$, with the result that V=q($N_A+N_{DA}-N_D-N_{DD}$)·W$^2$/2∈$_0$∈ is obtained. When this is applied to the present preferred embodiment, and then a leak current flows under the gate, since punch-through occurs in the region under the gate from the drain side to the source side in a lateral direction, instead of the thickness W of the GaN layer, the gate length $L_g$ is preferably used. In this way, q($N_A+N_{DA}-N_D-N_{DD}$)·$L_g^2$/2∈$_0$∈ which is the right-hand side of formula (5) is derived. On the other hand, although the right-hand side of formula (1) differs from formula (5) in that ($N_A+N_{DA}-N_D-N_{DD}$) of formula (5) is ($N_A+N_{DA}$), $N_A+N_{DA}$ is the minimum necessary amount for cancelling out the flux and it is sufficient that the right-hand side of formula (1) is satisfied, with consideration given to the fact that the residual donor is present in GaN, $N_A+N_{DA}-N_D-N_{DD}$ of formula (5) is more preferably satisfied.

In order to further enhance the reliability of the withstand voltage, the nitride semiconductor device 3 satisfies formula (2) or (6) below.

$$V_2 < q(N_A+N_{DA}) \cdot (L_g+L_{fp})^2/2\in_0 \in \qquad (2)$$

$$V_2 < q(N_A+N_{DA}-N_D-N_{DD}) \cdot (L_g+L_{fp})^2/2\in_0 \in \qquad (6)$$

In the formulas (2) and (6) described above, $V_2$ is the dielectric breakdown voltage or the maximum rated voltage of the device, ∈$_0$ is a vacuum permittivity and ∈ is the relative permittivity of the electron transit layer 14 (GaN). Since $V_2$ on the left-hand side of each of formulas (2) and (6) is the dielectric breakdown voltage or the maximum rated voltage of the device, it is a value which is determined according to each device. On the other hand, the right-hand side of each of formulas (2) and (6) represents a voltage when punch-through occurs in the field plate and under the gate and thus a leak current starts to flow. In other words, the inequalities represented by formulas (2) and (6) indicate that the dielectric breakdown voltage or the maximum rated voltage of the nitride semiconductor device 3 exceeds an applied voltage when the punch-through occurs in the field plate and under the gate and thus a leak current starts to flow, and that the reliability of the dielectric breakdown voltage or the maximum rated voltage determined by each device is thus high.

The dielectric breakdown voltage is a voltage in which the element itself cannot be used by being destroyed or an off-leak current is rapidly increased. On the other hand, the maximum rated voltage is a voltage which is prevented from being exceeded so that the reliability of the element is retained.

In the same manner as on the right-hand side of formulas (1) and (5) described above, it is possible to determine the right-hand side of formulas (2) and (6). When a leak current flows in the field plate and under the gate, since punch-through occurs in the region in the field plate and under the gate from the drain side to the source side in the lateral direction, instead of the thickness W of the GaN layer of V=q($N_A+N_{DA}-N_D-N_{DD}$)·W$_2^2$/2∈$_0$∈, the total sum of ($L_g$+$L_{fp}$) of the gate length and the field plate length is preferably used. In this way, q($N_A+N_{DA}-N_D-N_{DD}$)·($L_g+L_{fp}$)$^2$/2∈$_0$∈ which is the right-hand side of formulas (2) and (6) is derived.

Although the nitride semiconductor device 3 satisfies formulas (1), (2), (5) and (6) described above, it more preferably satisfies formula (3), (4), (7) or (8) below.

$$q(N_A+N_{DA}) \cdot L_g^2/2\in_0 \in < 1.2V_1 \qquad (3)$$

$$q(N_A+N_{DA}) \cdot (L_g+L_{fp})^2/2\in_0 \in < 1.2V_2 \qquad (4)$$

$$q(N_A+N_{DA}-N_D-N_{DD}) \cdot L_g^2/2\in_0 \in < 1.2V_1 \qquad (7)$$

$$q(N_A+N_{DA}-N_D-N_{DD}) \cdot (L_g+L_{fp})^2/2\in_0 \in < 1.2V_2 \qquad (8)$$

Formula (3), (4), (7) or (8) is satisfied, and it is thus possible to significantly decrease a parasitic capacitance while retaining the withstand voltage and the reliability, with the result that it is possible to achieve a high-speed switching operation.

Next, for a device which satisfies formulas (1), (2), (5) and (6) described above and a device which does not satisfy them, a simulation was performed on a potential distribution, a current density and a trap occupancy, and the results shown in FIGS. 11 to 17 are obtained.

Figure 11:
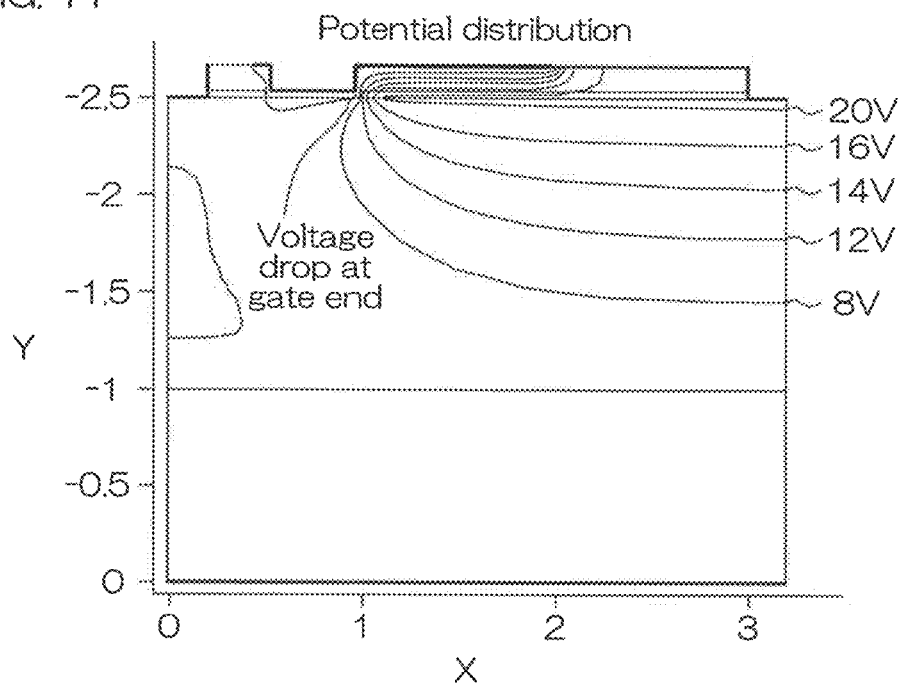
FIG. 11 is a simulation result showing the potential distribution of a nitride semiconductor device according to a reference example.
Figure 12:
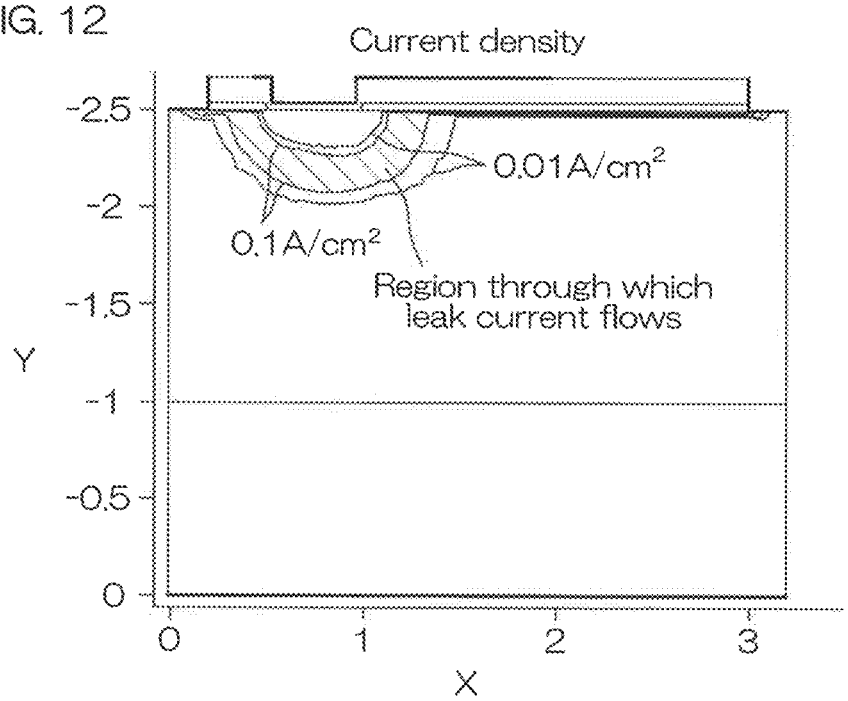
FIG. 12 is a simulation result showing the current density of the nitride semiconductor device according to the reference example.
Figure 13:
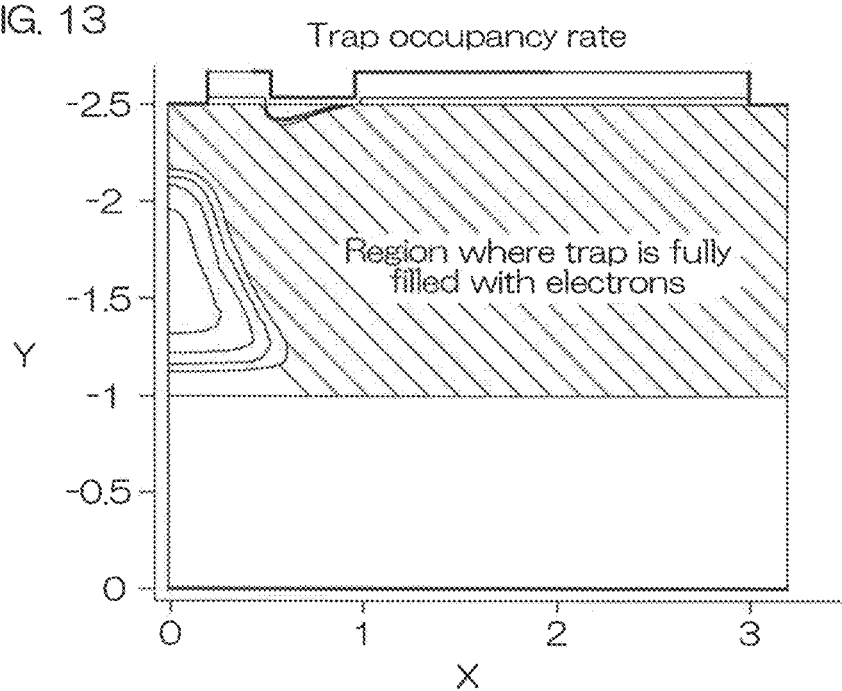
FIG. 13 is a simulation result showing the trap occupancy rate of the nitride semiconductor device according to the reference example.

FIGS. 11 to 13 are the results of the simulation on the nitride semiconductor device according to a reference example (which does not satisfy formulas (1), (2), (5) and (6) described above), FIG. 11 shows the potential distribution, FIG. 12 shows the current density and FIG. 13 shows the trap occupancy. On the other hand, FIGS. 14 to 16 are the results of the simulation on the nitride semiconductor device according to the present preferred embodiment (which satisfies formulas (1), (2), (5) and (6) described above), FIG. 14 shows the potential distribution, FIG. 15 shows the current density and FIG. 16 shows the trap occupancy.

The device according to the reference example will first be verified with reference to FIGS. 11 to 13. The verification was performed under conditions in which the drain voltage=20 V, the donor concentration $N_D$ of GaN=1×10$^{16}$ cm$^{-3}$, the deep acceptor concentration $N_{DA}$ of GaN=0.5×10$^{16}$ cm$^{-3}$ and the insulating film under the field plate: SiO$_2$ (thickness of 100 nm). As a result of the verification, in the reference example, as shown in FIG. 11, a voltage drop was not found under the field plate, and a voltage drop was produced at the end portion of the gate. Consequently, as shown in FIG. 12, a leak current was generated through the gate from the drain side to the source side. It is found from FIG. 13 that the entire trap (deep acceptor) under the gate was filled with electrons and that punch-through thus occurred under the gate.

Figure 14:
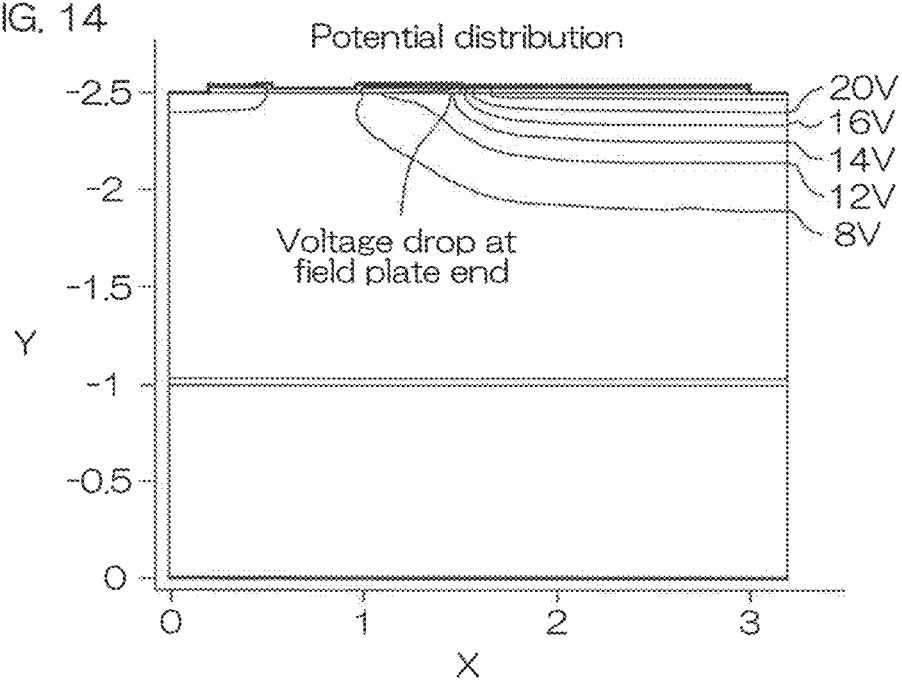
FIG. 14 is a simulation result showing the potential distribution of the nitride semiconductor device according to the preferred embodiment of the present invention.
Figure 15:
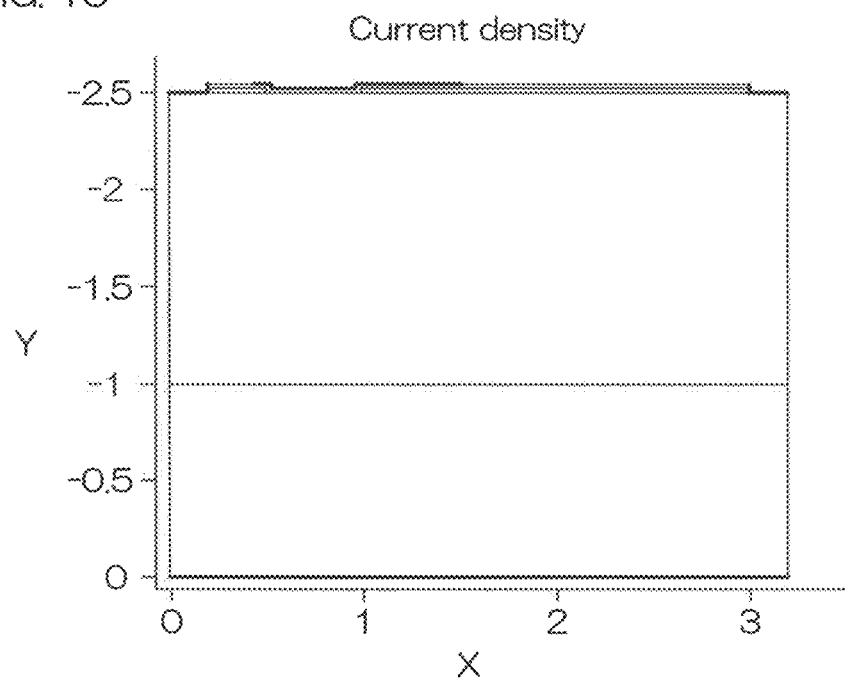
FIG. 15 is a simulation result showing the current density of the nitride semiconductor device according to the preferred embodiment of the present invention.
Figure 16:
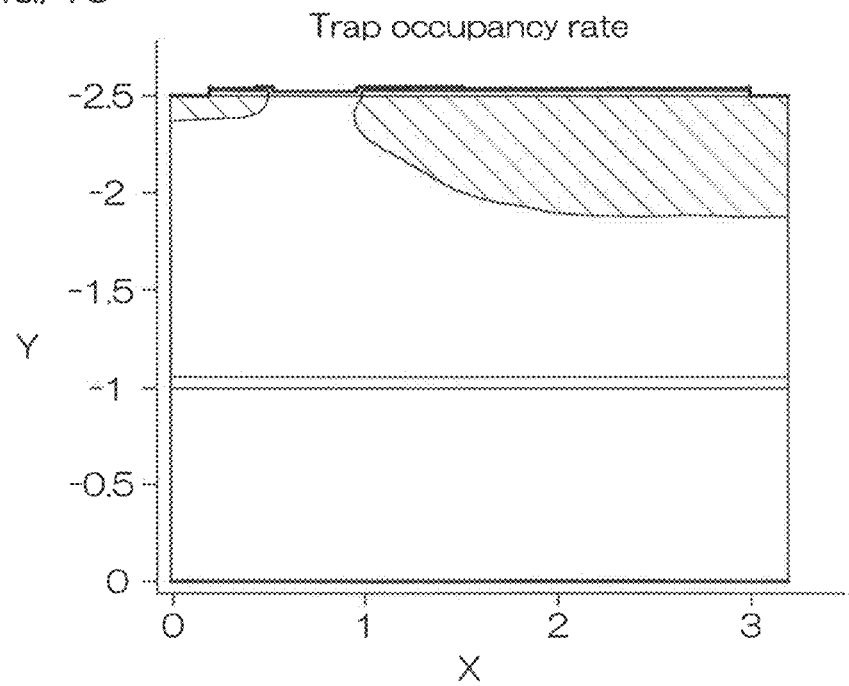
FIG. 16 is a simulation result showing the trap occupancy rate of the nitride semiconductor device according to the preferred embodiment of the present invention.

On the other hand, in the device of the present preferred embodiment which was verified under the same conditions as in the reference example except that the thickness of the insulating film under the field plate was set at 10 nm and that the depletion voltage $V_1$ was lowered, as shown in FIG. 14, a voltage drop was produced at the end portion of the field plate, and thus as shown in FIG. 15, almost no leak current flowed under the gate. It is found from FIG. 16 that on the trap occupancy, a margin for capturing electrons was still left in the trap under the gate.

Figure 17:
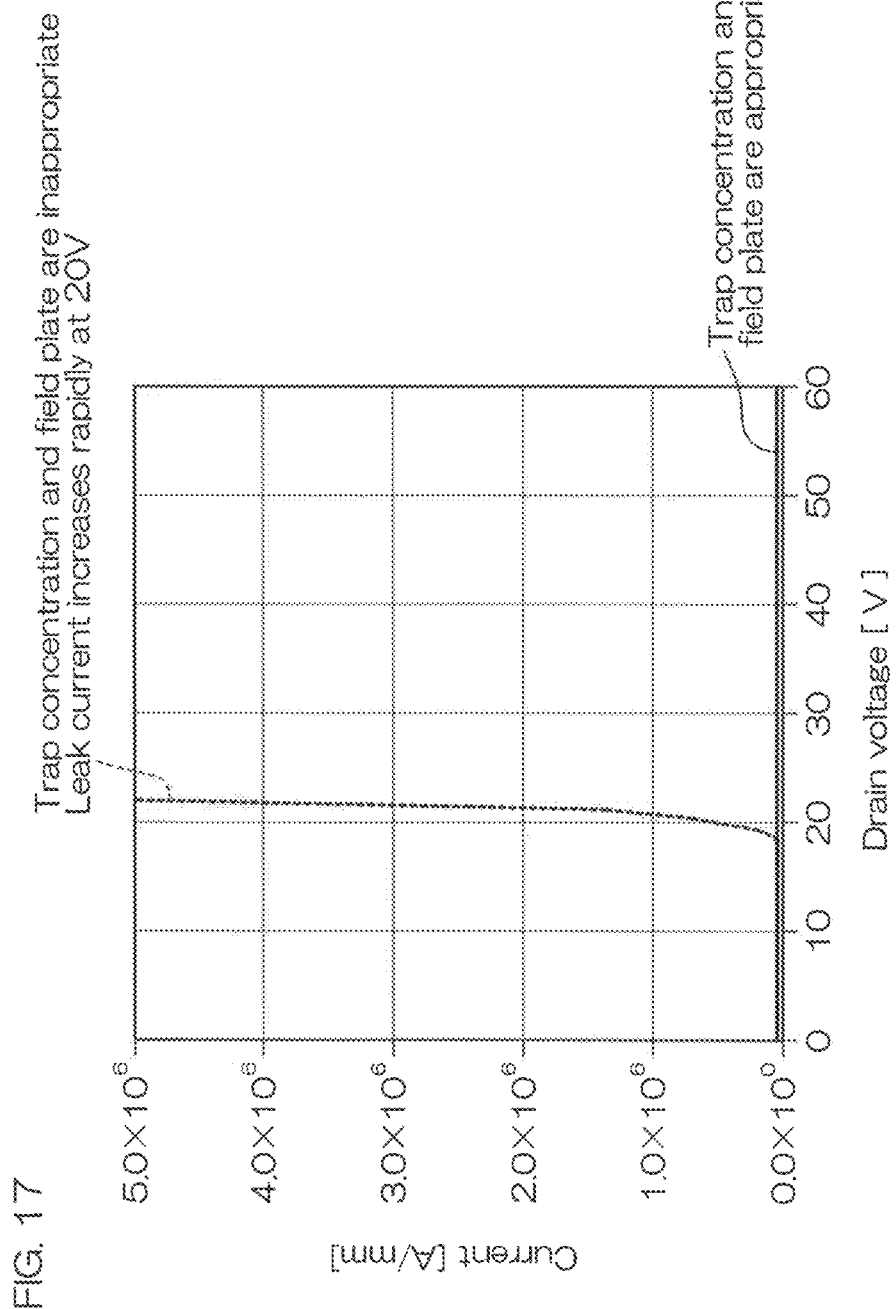
FIG. 17 is a graph in which leak currents in the present preferred embodiment and the reference example are compared.

FIG. 17 shows a comparison of the leak current between the device of the present preferred embodiment and the device of the reference example. As shown in FIG. 17, in the device which satisfies formulas (1), (2), (5) and (6) described above, almost no leak current flowed when the gate was off, and it is found that it is thus possible to enhance the withstand voltage as compared with the device which does not satisfy the formulas. Then, as is clear from each formula, the effect of the enhancement of the withstand voltage and the reliability described above can be realized by adjusting the values (such as the shallow acceptor concentration $N_A$ and the deep acceptor concentration $N_{DA}$) of the terms other than the gate length $L_g$ in each formula even if the gate length $L_g$ is reduced. Hence, the gate length $L_g$ is designed to be a desired length, and it is thus also possible to enhance the switching speed of the device while maintaining the withstand voltage.

A relationship, when the electron transit layer 14 is doped as an impurity with C (carbon), between the impurity concentration of the carbon and $N_A+N_{DA}-N_D-N_{DD}$ will then be described.

Figure 18:
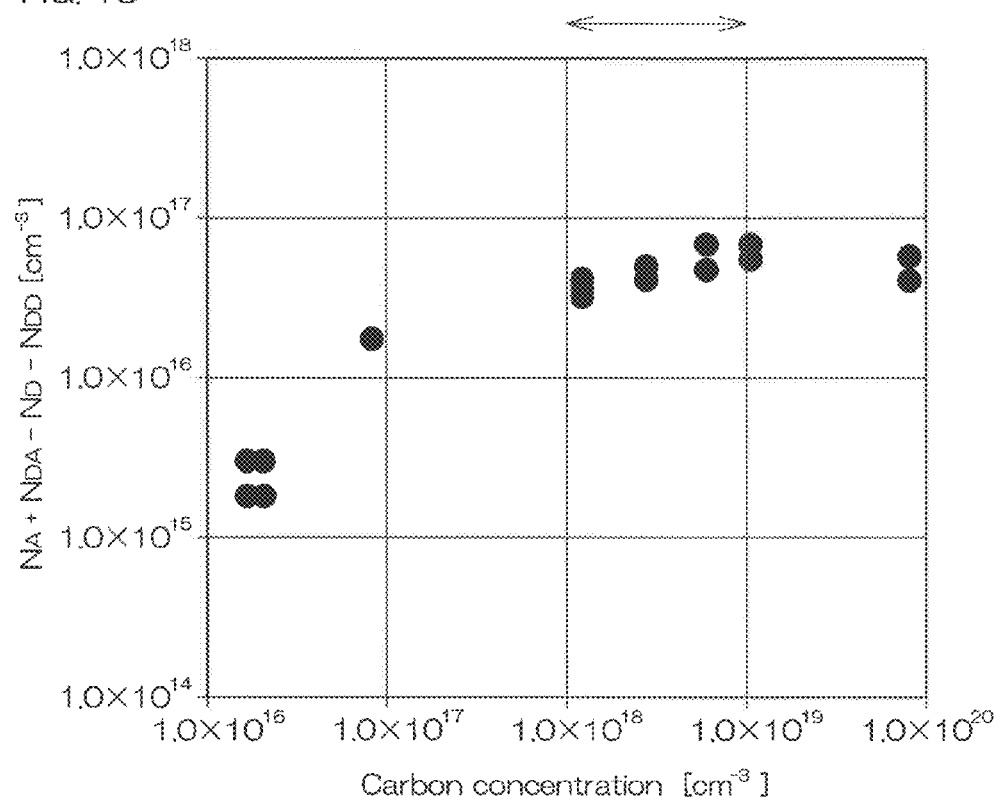
FIG. 18 is a diagram showing a relationship between a carbon concentration and $N_A+N_{DA}-N_D-N_{DD}$.

FIG. 18 is a diagram showing the relationship between the carbon concentration and $N_A+N_{DA}-N_D-N_{DD}$. Inequality (5) described previously is first referenced.

$$V_1 < q(N_A+N_{DA}-N_D-N_{DD}) \cdot L_g^2 / 2\epsilon_0 \epsilon \quad (5)$$

Formula (5) described above indicates that punch-through does not occur under the gate until the electron transit layer 14 is depleted under the field plate portion 192, and that it is thus possible to reduce a leak current under the gate. Hence, in order to satisfy formula (5) and to lower an on-resistance when the nitride semiconductor device 3 is operated, it is preferable to reduce the gate length $L_g$, to decrease a gate resistance component and to maximize the value of $N_A+N_{DA}-N_D-N_{DD}$ as much as possible.

In this point, with reference to FIG. 18, even when the electron transit layer 14 is doped with a large amount of carbon serving as the impurity, the carbon concentration is about 1×10$^{19}$ cm$^{-3}$, and the value of $N_A+N_{DA}-N_D-N_{DD}$ is saturated. On the other hand, when the electron transit layer 14 is doped with the carbon whose concentration is 1×10$^{19}$ cm$^{-3}$, the crystal quality of the electron transit layer 14 is disadvantageously lowered. In other words, it is found from FIG. 18 that the carbon concentration preferably falls within a range of 1×10$^{18}$ cm$^{-3}$ to 1×10$^{19}$ cm$^{-3}$. In this range, even when the gate length $L_g$ is reduced, and the gate resistance component is decreased, since the value of $N_A+N_{DA}-N_D-N_{DD}$ can be increased without any effect such as the lowering of the crystal quality, it is possible to satisfy formula (5) while reducing the on-resistance of the nitride semiconductor device 3.

Although the carbon concentration in the range of 1×10$^{18}$ cm$^{-3}$ to 1×10$^{19}$ cm$^{-3}$ may be applied to the entire electron transit layer 14, it is preferably applied to a region away from the interface with the electron supply layer 15, and a carbon concentration dropping below the above range is preferably applied to the interface portion with the electron supply layer 15. This is demonstrated by FIGS. 19A, 19B, 20A, 20B and 20C.

Figure 19A:
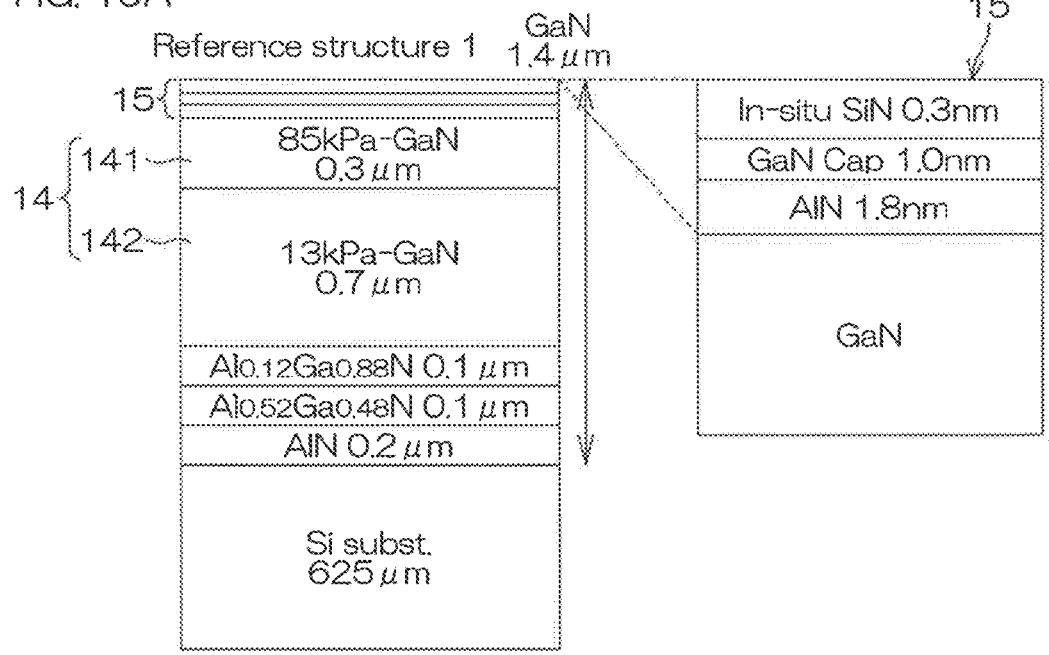
FIG. 19A is a diagram showing a reference structure 1 which is set for simulation.
Figure 19B:
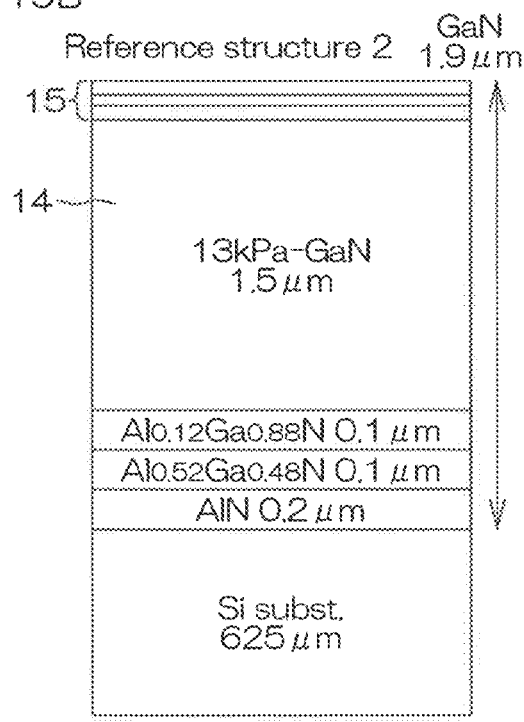
FIG. 19B is a diagram showing a reference structure 2 which is set for simulation.

FIGS. 19A and 19B are respectively diagrams showing a reference structure 1 and a reference structure 2 which are set for simulation. In FIGS. 19A and 19B, among symbols shown in FIG. 2, only symbols necessary for the following description are shown, and symbols for the corresponding portions other than those are omitted.

With reference to FIGS. 19A and 19B, the reference structure 1 differs from reference structure 2 in that the electron transit layer 14 of the reference structure 1 includes a first region 141 forming the interface between the electron transit layer 14 and the electron supply layer 15 and a second region 142 formed in a portion (in this preferred embodiment, 0.3 μm=300 nm) away from the interface. In both the structures, a pressure unit shown on the left side of "GaN" in the electron transit layer 14 indicates a growth pressure when GaN is grown. The growth pressure and a growth temperature when GaN is grown by using an MOCVD are lowered, and it is thus possible to increase the introduction amount of carbon into GaN crystal structure. Carbon is contained in TMG which is a supply source of gallium during the growth of GaN. Hence, in the reference structure 1 of FIG. 19A, the carbon concentration of the second region 142 is 1×10$^{18}$ cm$^{-3}$ to 1×10$^{19}$ cm$^{-3}$ whereas the carbon concentration of the first region 141 is equal to or less than 1×10$^{17}$ cm$^{-3}$. In the reference structure 2 of FIG. 19B, the carbon concentration of the entire electron transit layer 14 is 1×10$^{18}$ cm$^{-3}$ to 1×10$^{19}$ cm$^{-3}$.

Figure 20A:
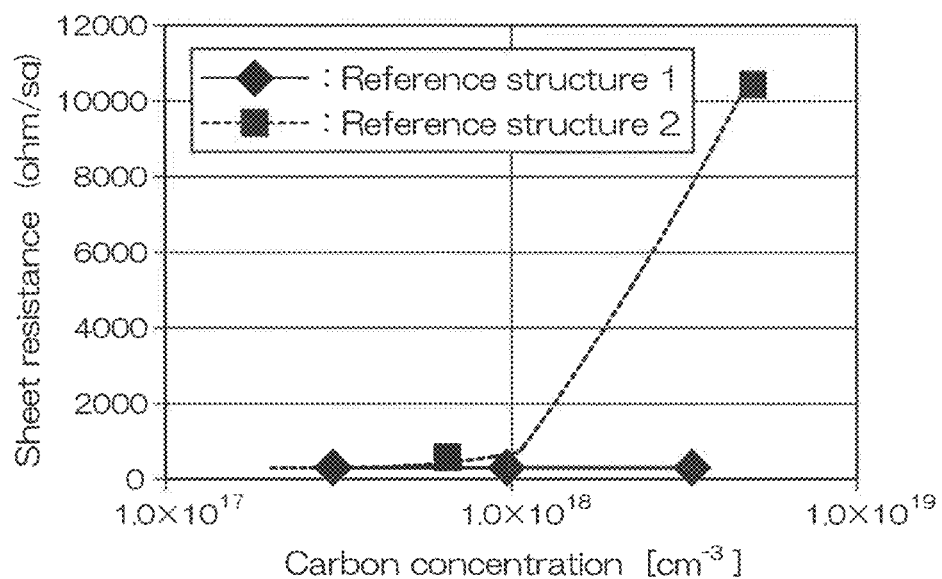
FIG. 20A is a diagram showing a relationship between the carbon concentration and the sheet resistance of the two-dimensional electron gas.
Figure 20B:
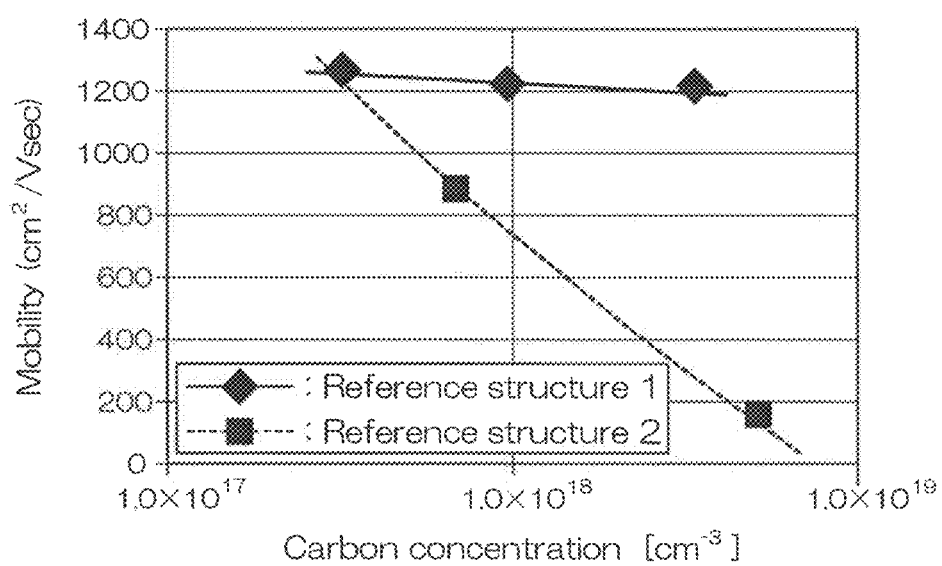
FIG. 20B is a diagram showing a relationship between the carbon concentration and the mobility of the two-dimensional electron gas.
Figure 20C:
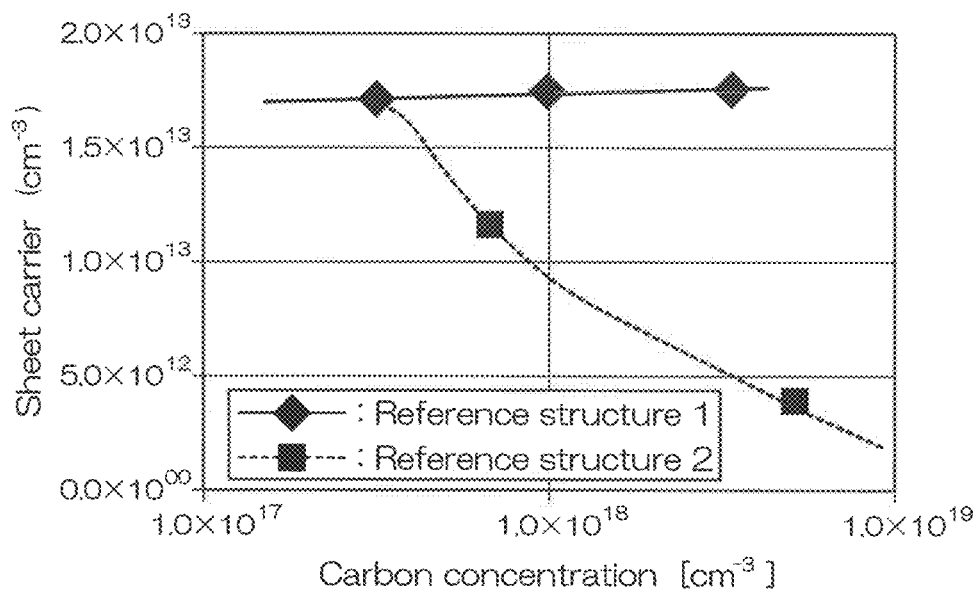
FIG. 20C is a diagram showing a relationship between the carbon concentration and the sheet carrier density of the two-dimensional electron gas.

For each structure, FIG. 20A shows a relationship between the carbon concentration and the sheet resistance of the two-dimensional electron gas, FIG. 20B shows a relationship between the carbon concentration and the mobility of the two-dimensional electron gas and FIG. 20C shows a relationship between the carbon concentration and the sheet carrier density of the two-dimensional electron gas.

As shown in FIGS. 20A to 20C, in the reference structure 2, the carbon concentration of the electron transit layer 14 is uniformly increased, with the result that the sheet resistance of the two-dimensional electron gas is increased and that the mobility and the sheet carrier density of the two-dimensional electron gas are lowered. By contrast, in the reference structure 1, the carbon concentration of the interface portion with the electron supply layer 15 is so lowered as to be equal to or less than 1×10$^{17}$ cm$^{-3}$, with the result that the sheet resistance, the mobility and the sheet carrier density of the two-dimensional electron gas remain substantially the same.

Figure 21:
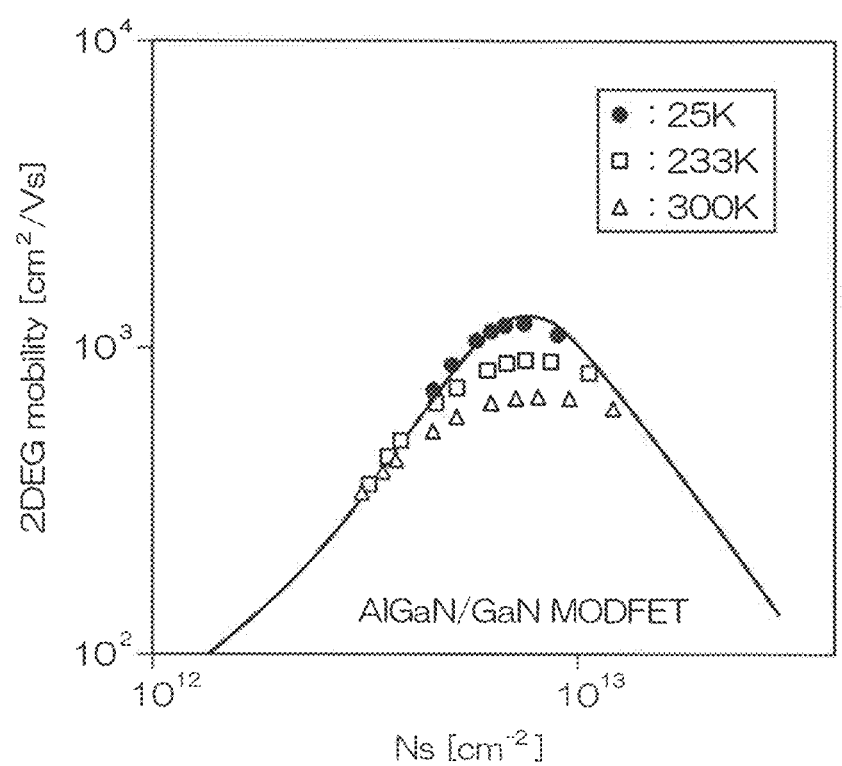
FIG. 21 is a diagram showing a relationship between the sheet carrier density $N_S$ and the mobility (2DEG mobility) of the two-dimensional electron gas.

On the other hand, it is found that as shown in FIG. 21, in the junction of AlGaN/GaN, the mobility of the two-dimensional electron gas depends on the sheet carrier density $N_S$, and that the maximum value substantially falls within a range of $N_S$=8×10$^{12}$ cm$^{12}$ to 1×10$^{13}$ cm$^{-2}$. Hence, in the following description, under the assumption that $N_S$=8×10$^{12}$ cm$^{-2}$ to 1×10$^{13}$ cm$^{-2}$, a preferable gate length $L_g$ is calculated, and a relationship between the gate length $L_g$ and the thickness of the gate insulating film 16 is determined.

Figure 22A:
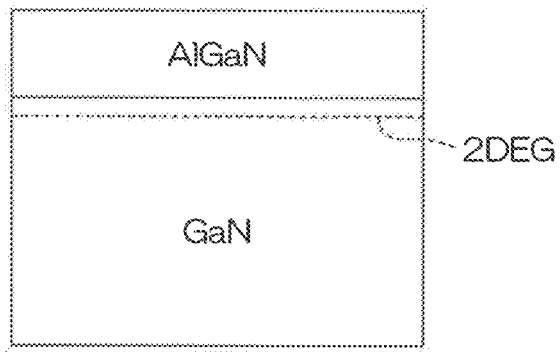
FIG. 22A is a diagram showing a structure of AlGaN/GaN between a gate and a drain.

As shown in FIG. 22A, between the gate and the drain, in the AlGaN/GaN interface, the two-dimensional electron gas (2DEG) is spread by polarization caused by the hetero junction and the lattice mismatch thereof. Here, when the mobility of the two-dimensional electron gas is determined based on the assumption that $N_S=8\times10^{12}$ cm$^{-2}$ to $1\times10^{13}$ cm$^{-2}$, the mobility μ=about 1500 cm$^2$/V$_S$. Thus, when the sheet resistance of the AlGaN/GaN interface portion is determined, the sheet resistance Rs=400 to 500 Ω/sq.

Figure 22B:
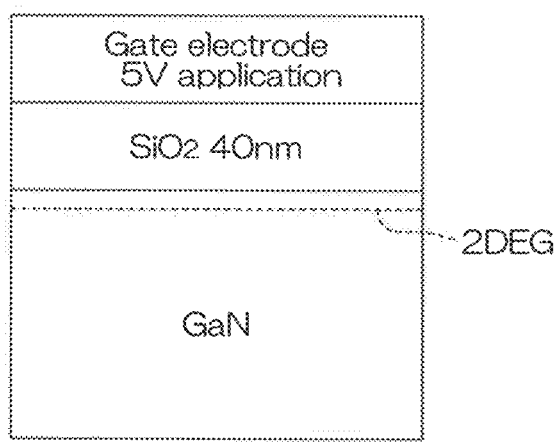
FIG. 22B is a diagram showing a structure of AlGaN/GaN in a gate portion.

On the other hand, for the gate portion, as shown in FIG. 22B, a case where the gate insulating film has a single layer structure (film thickness=40 nm) of SiO$_2$ and where a gate voltage of 5 V is applied is considered. The sheet carrier density $N_S$ of the two-dimensional electron gas generated when the gate voltage is applied is about $6\times10^{12}$ cm$^{-2}$, and the mobility μ and the sheet resistance Rs determined therefrom are respectively μ=100 to 200 cm$^2$/Vs and Rs=5000 to 10000 Ω/sq.

Here, for a device whose withstand voltage between the gate and the drain is 200 V, it is necessary to provide a distance of at least about 6 μm between the gate and the drain. In this case, as described previously, with consideration given to the fact that the sheet resistance Rs of the gate portion is about 10 times as high as the sheet resistance Rs between the gate and the drain, if the gate length $L_g$ is not set at about one tenth of the distance (6 μm) between the gate and the drain, the resistance cannot be uniformized, with the result that most of the on-resistance is the resistance of the gate portion. Hence, the gate length $L_g$ is preferably set equal to or less than 0.6 μm.

Figure 23:
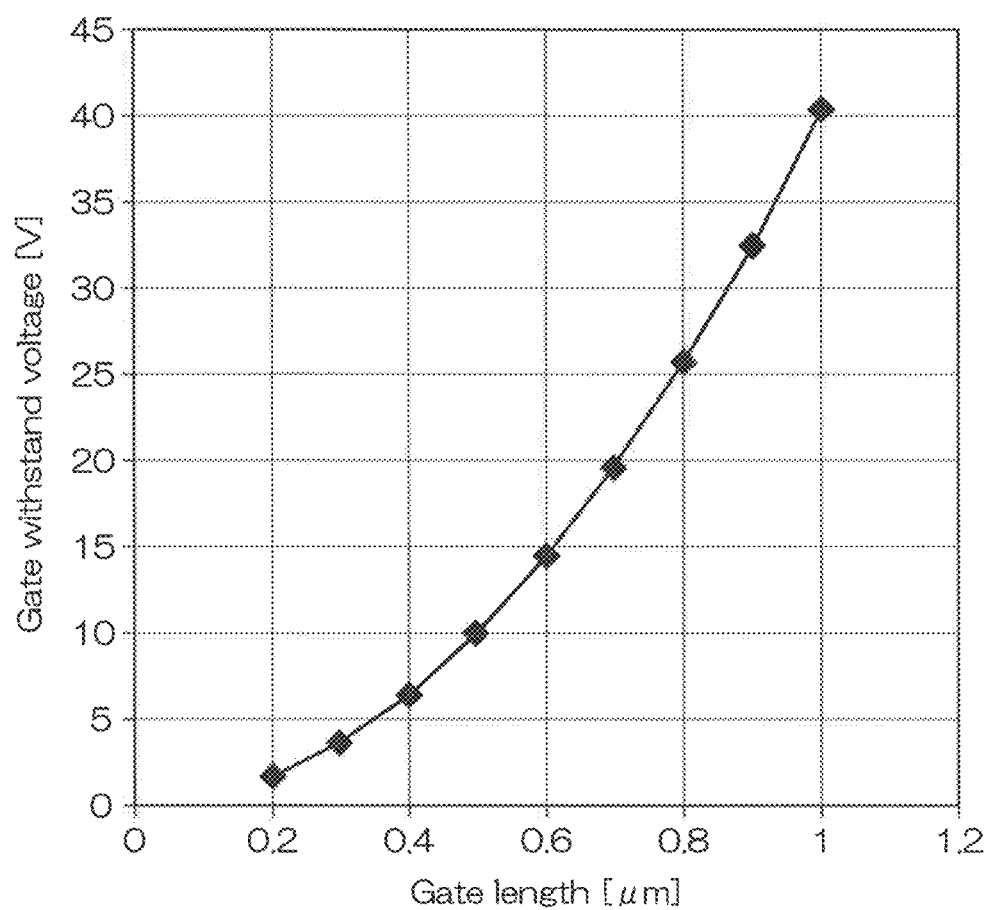
FIG. 23 is a diagram showing a relationship between a gate length and a gate withstand voltage.

FIG. 23 shows a relationship between a gate length $L_g$ and a gate withstand voltage when $N_A+N_{DA}-N_D-N_{DD}$ is the lower limit value (about $4\times10^{16}$ cm$^{-3}$) in the range ($1\times10^{18}$ cm$^{-3}$ to $1\times10^{19}$ cm$^{-3}$) of a preferable carbon concentration in FIG. 18.

As shown in FIG. 23, when the gate length $L_g$ is 0.6 μm, the gate withstand voltage is about 15 V. In other words, when a voltage of 15 V is applied to the gate, as shown in FIG. 12, a leak current caused by punch-through is generated under the gate. Hence, in order to prevent such a leak current from being generated, it is necessary to deplete the part under the field plate portion 192 with a voltage lower than the voltage value of the gate withstand voltage.

Figure 24:
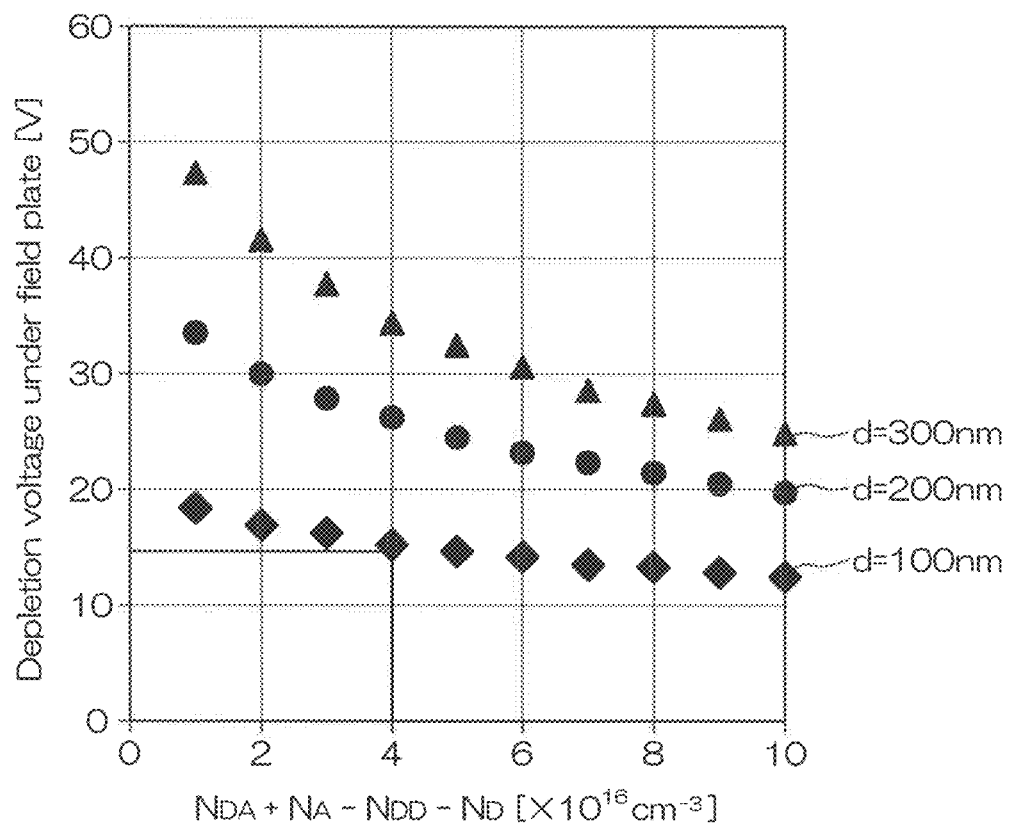
FIG. 24 is a diagram showing a relationship between $N_A+N_{DA}-N_D-N_{DD}$ and the depletion voltage under the field plate.

FIG. 24 is a diagram showing a relationship between $N_A+N_{DA}-N_D-N_{DD}$ and the depletion voltage under the field plate. FIG. 24 shows a relationship when the thickness of the gate insulating film (SiN) is d=100 nm, d=200 nm and d=300 nm.

As shown in FIG. 24, the depletion voltage when $N_A+N_{DA}-N_D-N_{DD}=4\times10^{16}$ cm$^{-3}$ is 14 V in a case where d=100 nm, is 26 V in a case where d=200 nm or is 34 V in a case where d=300 nm, and it is found that only in the case where d=100 nm, depletion voltage<gate withstand voltage (15 V) is satisfied. In other words, under the assumption that the relative permittivity of SiN ∈=7, when d/∈ is equal to or less than 14, before the generation of punch-through under the gate, the part under the field plate portion 192 is depleted, and it is thus possible to reduce the leak current.

Although the preferred embodiment of the present invention is described above, the present invention can also be practiced with still other preferred embodiments.

For example, the field plate portion 192 does not need to be formed integrally with the gate main body portion 191, and may be formed as a field plate which is separated from the gate main body portion 191. In this case, the field plate may be electrically connected to the source electrode 17.

In the nitride semiconductor device 3, even when formula (9) or (11) is satisfied and more preferably even when formula (10) or (12) is satisfied, it is possible to enhance the withstand voltage.

$$N_S^2/(N_A+N_{DA}-N_D-N_{DD})<(N_A+N_{DA}-N_D-N_{DD})\cdot(L_g+L_{fp})^2 \qquad (9)$$

$$N_S^2/(N_A+N_{DA})<(N_A+N_{DA})\cdot(L_g+L_{fp})^2 \qquad (11)$$

$$(N_A+N_{DA}-N_D-N_{DD})\cdot(L_g+L_{fp})^2<1.2N_S^2/(N_A+N_{DA}-N_D-N_{DD}) \qquad (10)$$

$$(N_A+N_{DA})\cdot(L_g+L_{fp})^2<1.2N_S^2/(N_A+N_{DA}) \qquad (12)$$

In FIG. 2, the left-hand side of $N_S^2/(N_A+N_{DA}-N_D-N_{DD})$ in formula (9) represents the voltage $V_3$ (which is described with reference to FIG. 8) with which the two-dimensional electron gas from the end portion of the field plate portion 192 on the side of the drain electrode 18 to the drain electrode 18 is depleted. On the other hand, the right-hand side of $(N_A+N_{DA}-N_D-N_{DD})\cdot(L_g+L_{fp})^2$ in formula (9) represents a withstand voltage which can be retained by the gate electrode 19 (the gate main body portion 191+the field plate portion 192).

Until the two-dimensional electron gas from the end portion of the field plate portion 192 on the side of the drain electrode 18 to the drain electrode 18 is depleted, a voltage drop is produced in the gate main body portion 191 and the field plate portion 192 whereas when the two-dimensional electron gas from the end portion of the field plate portion 192 to the drain electrode 18 is depleted, a voltage drop is produced from the gate main body portion 191 to the drain electrode 18. In other words, at a low drain voltage, a withstand voltage in the section A of FIG. 2 is retained whereas at a high drain voltage, a withstand voltage in the section B of FIG. 2 is retained. Hence, formulas (9) and (11) mean that until the two-dimensional electron gas from the end portion of the field plate portion 192 on the side of the drain electrode 18 to the drain electrode 18 is depleted, the withstand voltage is retained by at least the gate electrode 19 (the gate main body portion 191+the field plate portion 192).

Although in the preferred embodiment described above, the example where the electron transit layer 14 is formed with the GaN layer and the electron supply layer 15 is formed of AlGaN is described, the electron transit layer 14 preferably differs from electron supply layer 15 in the Al composition, and other combinations are also possible. The combination between the electron supply layer and the electron transit layer may be any one of AlGaN layer/GaN layer, AlGaN layer/AlGaN layer (where the Al composition is different), AlInN layer/AlGaN layer, AlInN layer/GaN layer, AlN layer/GaN layer and AlN layer/AlGaN layer. More generally, the electron supply layer contains Al and N in its composition. The electron transit layer contains Ga and N in its composition, and has an Al composition different from the electron supply layer. The electron supply layer differs from electron transit layer in the Al composition, and a lattice mismatch thus occurs therebetween, with the result that a carrier caused by polarization contributes to the formation of the two-dimensional electron gas.

Although in the preferred embodiment described above, as an example of the material of the substrate 12, silicon is used, an arbitrary substrate material such as a sapphire substrate or a GaN substrate can be applied.

Various design modifications are possible within a range described in the scope of claims.

What is claimed is:

1. A nitride semiconductor device comprising:
a nitride semiconductor layer having a gate, a source and a drain; and
a field plate on the nitride semiconductor layer electrically connected to the gate or the source,
wherein formulas (1) and (2), below, are satisfied when a drain voltage value is $V_1(V)$ and a value of $C_{OSS}$ is reduced to one half of a value when a drain voltage is 0 V, a dielectric breakdown voltage of the device is $V_2(V)$, a gate length is $L_g$(cm), a field plate length is $L_{fp}$(cm), a shallow acceptor concentration is $N_A(/cm^3)$, a deep acceptor concentration is $N_{DA}(/cm^3)$, a vacuum permittivity is $\in_0$, and a relative permittivity of the nitride semiconductor layer is $\in$, and
wherein when a voltage $V_3(V)$, that is larger than $V_1(V)$ and smaller than $V_2(V)$, is applied to the drain, a voltage drop is produced under the field plate and two regions where a trap is fully filled with electrons are produced at both sides sandwiching a region under the gate such that the two regions are separated from each other $$V_1 < q(N_A+N_{DA}) \cdot L_g^2/2\in_0\in \qquad (1)$$

$$V_2 < q(N_A+N_{DA}) \cdot (L_g+L_{fp})^2/2\in_0\in \qquad (2).$$

2. The nitride semiconductor device according to claim 1, wherein formulas (3) and (4) below are satisfied $$q(N_A+N_{DA}) \cdot L_g^2/2\in_0\in < 1.2V_1 \qquad (3)$$

$$q(N_A+N_{DA}) \cdot (L_g+L_{fp})^2/2\in_0\in < 1.2V_2 \qquad (4)$$

3. A nitride semiconductor device comprising:
a nitride semiconductor layer having a gate, a source and a drain; and
a field plate on the nitride semiconductor layer electrically connected to the gate or the source,
wherein formulas (5) and (6), below, are satisfied when a drain voltage value $V_1(V)$ and a value of $C_{OSS}$ is reduced to one half of a value when a drain voltage is 0 V, a dielectric breakdown voltage of the device is $V_2(V)$, a gate length is $L_g$(cm), a field plate length is $L_{fp}$(cm), a shallow donor concentration is $N_D(/cm^3)$, a deep donor concentration is $N_{DD}(/cm^3)$, a shallow acceptor concentration is $N_A(/cm^3)$, a deep acceptor concentration is $N_{DA}(/cm^3)$, a vacuum permittivity is $\in_0$, and a relative permittivity of the nitride semiconductor layer is $\in$, and
wherein when a voltage $V_3(V)$ that is larger than $V_1(V)$ and smaller than $V_2(V)$, is applied to the drain, a voltage drop is produced under the field plate and two regions where a trap is fully filled with electrons are produced at both sides sandwiching a region under the gate such that the two regions are separated from each other $$V_1 < q(N_A+N_{DA}-N_D-N_{DD}) \cdot L_g^2/2\in_0\in \qquad (5)$$

$$V_2 < q(N_A+N_{DA}-N_D-N_{DD}) \cdot (L_g+L_{fp})^2/2\in_0\in \qquad (6).$$

4. The nitride semiconductor device according to claim 3, wherein formulas (7) and (8) below are satisfied $$q(N_A+N_{DA}-N_D-N_{DD}) \cdot L_g^2/2\in_0\in < 1.2V_1 \qquad (7)$$

$$q(N_A+N_{DA}-N_D-N_{DD}) \cdot (L_g+L_{fp})^2/2\in_0\in < 1.2V_2 \qquad (8).$$

5. A nitride semiconductor device comprising:
a nitride semiconductor layer having a gate, a source and a drain; and
a field plate on the nitride semiconductor layer electrically connected to the gate or the source,
wherein formulas (1) and (2), below, are satisfied when a drain voltage value is $V_1(V)$ and a value of $C_{OSS}$ is reduced to one half of a value when a drain voltage is 0 V, a maximum rated voltage of the device is $V_2(V)$, a gate length is $L_g$(cm), a field plate length is $L_{fp}$(cm), a shallow acceptor concentration is $N_A(/cm^3)$, a deep acceptor concentration is $N_{DA}(/cm^3)$, a vacuum permittivity is $\in_0$, and a relative permittivity of the nitride semiconductor layer is $\in$, and
wherein when a voltage $V_3(V)$ that us larger than $V_1(V)$ and smaller than $V_2(V)$, is applied to the drain, a voltage drop is produced under the field plate and two regions where a trap is fully filled with electrons are produced at both sides sandwiching a region under the gate such that the two regions are separated from each other $$V_1 < q(N_A+N_{DA}) \cdot L_g^2/2\in_0\in \qquad (1)$$

$$V_2 < q(N_A+N_{DA}) \cdot (L_g+L_{fp})^2/2\in_0\in \qquad (2).$$

6. The nitride semiconductor device according to claim 5, wherein formulas (3) and (4) below are satisfied $$q(N_A+N_{DA}) \cdot L_g^2/2\in_0\in < 1.2V_1 \qquad (3)$$

$$q(N_A+N_{DA}) \cdot (L_g+L_{fp})^2/2\in_0\in < 1.2V_2 \qquad (4).$$

7. A nitride semiconductor device comprising:
a nitride semiconductor layer having a gate, a source and a drain; and
a field plate on the nitride semiconductor layer electrically connected to the gate or the source,
wherein formulas (5) and (6), below, are satisfied when a drain voltage value is $V_1$ (V) and a value of $C_{OSS}$ is reduced to one half of a value when a drain voltage is 0 V, a maximum rated voltage of the device is $V_2(V)$, a gate length is $L_g$(cm), a field plate length is $L_{fp}$(cm), a shallow donor concentration is $N_D(/cm^3)$, a deep donor concentration is $N_{DD}(/cm^3)$, a shallow acceptor concentration is $N_A(/cm^3)$, a deep acceptor concentration is $N_{DA}(/cm^3)$, a vacuum permittivity is $\in_0$, and a relative permittivity of the nitride semiconductor layer is $\in$, and
wherein when a voltage $V_3(V)$ that is larger than $V_1(V)$ and smaller than $V_2(V)$, is applied to the drain, a voltage drop is produced under the field plate and two regions where a trap is fully filled with electrons are produced at both sides sandwiching a region under the gate such that the two regions are separated from each other $$V_1 < q(N_A+N_{DA}-N_D-N_{DD}) \cdot L_g^2/2\in_0\in \qquad (5)$$

$$V_2 < q(N_A+N_{DA}-N_D-N_{DD}) \cdot (L_g+L_{fp})^2/2\in_0\in \qquad (6).$$

8. The nitride semiconductor device according to claim 7, wherein formulas (7) and (8) below are satisfied $$q(N_A+N_{DA}-N_D-N_{DD}) \cdot L_g^2/2\in_0\in < 1.2V_1 \qquad (7)$$

$$q(N_A+N_{DA}-N_D-N_{DD}) \cdot (L_g+L_{fp})^2/2\in_0\in < 1.2V_2 \qquad (8).$$

9. A nitride semiconductor device comprising:
a nitride semiconductor layer having a gate, a source and a drain; and
a field plate on the nitride semiconductor layer electrically connected to the gate or the source,
wherein formulas (5) and (9), below, are satisfied when a drain voltage value is $V_1(V)$ and a value of $C_{OSS}$ is reduced to one half of a value when a drain voltage is 0 V, a sheet carrier density of a two-dimensional electron gas is $N_S(/cm^2)$, a gate length is $L_g(cm)$, a field plate length is $L_{fp}(cm)$, a shallow donor concentration is $N_D(/cm^3)$, a deep donor concentration is $N_{DD}(/cm^3)$, a shallow acceptor concentration is $N_A(/cm^3)$, a deep acceptor concentration is $N_{DA}(/cm^3)$, a vacuum permittivity is $\in_0$, and a relative permittivity of the nitride semiconductor layer is $\in$, and wherein when a voltage $V_3(V)$, that is larger than $V_1(V)$ and smaller than $V_2(V)$, is applied to the drain, a voltage drop is produced under the field plate and two regions where a trap is fully filled with electrons are produced at both sides sandwiching a region under the gate such that the two regions are separated from each other $$V_1 < q(N_A+N_{DA}-N_D-N_{DD}) \cdot L_g^2/2\in_0\in \quad (5)$$

$$N_S^2/(N_A+N_{DA}-N_D-N_{DD}) < (N_A+N_{DA}-N_D-N_{DD}) \cdot (L_g+L_{fp})^2 \quad (9)$$

10. The nitride semiconductor device according to claim 9, wherein formulas (7) and (10) below are satisfied $$q(N_A+N_{DA}-N_D-N_{DD}) \cdot L_g^2/2\in_0\in < 1.2V_1 \quad (7)$$

$$(N_A+N_{DA}-N_D-N_{DD}) \cdot (L_g+L_{fp})^2 < 1.2N_S^2/(N_A+N_{DA}-N_D-N_{DD}) \quad (10).$$

11. A nitride semiconductor device comprising:
a nitride semiconductor layer having a gate, a source and a drain; and
a field plate on the nitride semiconductor layer electrically connected to the gate or the source,
wherein formulas (1) and (11), below, are satisfied when it is assumed that a drain voltage value is $V_1$ (V) and a value of $C_{OSS}$ is reduced to one half of a value when a drain voltage is 0 V, a sheet carrier density of a two-dimensional electron gas is $N_S(/cm^2)$, a gate length is $L_g(cm)$, a field plate length is $L_{fp}(cm)$, a shallow acceptor concentration is $N_A(/cm^3)$, a deep acceptor concentration is $N_{DA}(/cm^3)$, a vacuum permittivity is $\in_0$ and a relative permittivity of the nitride semiconductor layer is $\in$, and wherein when a voltage $V_3(V)$ that larger than $V_1(V)$ and smaller than $V_2(V)$, is applied to the drain, a voltage drop is produced under the field plate and two regions where a trap is fully filled with electrons are produced at both sides sandwiching a region under the gate such that the two regions are separated from each other $$V_1 < q(N_A+N_{DA}) \cdot L_g^2/2\in_0\in \quad (1)$$

$$N_S^2/(N_A+N_{DA}) < (N_A N_{DA}) \cdot (L_g+L_{fp})^2 \quad (11).$$

12. The nitride semiconductor device according to claim 11, wherein formulas (3) and (12) below are satisfied $$q(N_A+N_{DA}) \cdot L_g^2/2\in_0\in < 1.2V_1 \quad (3)$$

$$(N_A+N_{DA}) \cdot (L_g+L_{fp})^2 < 1.2N_S^2/(N_A+N_{DA}) \quad (12).$$

13. The nitride semiconductor device according to claim 1, wherein the gate length $L_g$ is equal to or less than 0.5 μm, the field plate length $L_{fp}$ is equal to or less than 0.5 μm and a maximum rated voltage of the device is equal to or more than 50 V.

14. The nitride semiconductor device according to claim 1, wherein the nitride semiconductor layer is doped with at least one type of impurity selected from a group consisting of C, Be, Cd, Ca, Cu, Ag, Au, Sr, Ba, Li, Na, K, Sc, Zr, Fe, Co, Ni, Mg, Ar and He such that a deep acceptor level is formed.

15. A nitride semiconductor device comprising:
a nitride semiconductor layer which includes an electron transit layer and an electron supply layer that is in contact with the electron transit layer and that has a composition different from the electron transit layer;
a gate, a source and a drain on the nitride semiconductor layer; and
a field plate on the nitride semiconductor layer electrically connected to the gate or the source,
wherein at least a part of the electron transit layer contains carbon, and a concentration of the carbon is $1 \times 10^{18}$ cm$^{-3}$ to $1 \times 10^{19}$ cm$^{-3}$, and
wherein when a drain voltage value is $V_1(V)$ and a value of $C_{OSS}$ is reduced to one half of a value when a drain voltage is 0 V, a dielectric breakdown voltage of the device is $V_2(V)$, and a voltage $V_3(V)$, that is larger than $V_1(V)$ and smaller than $V_2(V)$, is applied to the drain, a voltage drop is produced under the field plate and two regions where a trap is fully filled with electrons are produced at both sides sandwiching a region under the gate such that the two regions are separated from each other.

16. The nitride semiconductor device according to claim 15,
wherein the electron transit layer includes a first region that forms an interface between the electron transit layer and the electron supply layer and a second region that is formed in a part 50 nm or more apart from the interface, and
a carbon concentration of the second region is $1 \times 10^{18}$ cm$^{-3}$ to $1 \times 10^{19}$ cm$^{-3}$, and a carbon concentration of the first region is equal to or less than $1 \times 10^{17}$ cm$^{-3}$.

17. The nitride semiconductor device according to claim 16,
wherein when it is assumed that a shallow donor concentration is $N_D(/cm^3)$, a deep donor concentration is $N_{DD}(/cm^3)$, a shallow acceptor concentration is $N_A(/cm^3)$ and a deep acceptor concentration is $N_{DA}(/cm^3)$, $N_A+N_{DA}-N_D-N_{DD}$ in the second region of the electron transit layer is $4 \times 10^{16}$ cm$^{-3}$ to $8 \times 10^{16}$ cm$^{-3}$.

18. A nitride semiconductor device comprising:
a nitride semiconductor layer which includes an electron transit layer and an electron supply layer that is in contact with the electron transit layer and that has a composition different from the electron transit layer;
a gate, a source and a drain on the nitride semiconductor layer; and
a field plate which is electrically connected to the gate or the source and which is arranged on the nitride semiconductor layer via an insulating film,
wherein a gate length $L_g$ is equal to or less than 0.6 μm, at least a part of the electron transit layer contains carbon, a concentration of the carbon is equal to or more than $1 \times 10^{18}$ cm$^{-3}$ and when it is assumed that a thickness of the insulating film under the field plate is d, and a relative permittivity of the insulating film is $\in$, $d/\in \leq 14$ is satisfied, and
wherein when a drain voltage value is $V_1(V)$ and a value of $C_{OSS}$ is reduced to one half of a value when a drain voltage is 0 V, a dielectric breakdown voltage of the device is $V_2(V)$, and a voltage $V_3(V)$, that is larger than $V_1(V)$ and smaller than $V_2(V)$, is applied to the drain, a voltage drop is produced under the field plate and two regions where a trap is fully filled with electrons are produced at both sides sandwiching a region under the gate such that the two regions are separated from each other.

19. The nitride semiconductor device according to claim 13, wherein the nitride semiconductor layer is made of GaN,
the drain voltage value $V_1$ is 20 V,
the deep acceptor concentration $N_{DA}$ is $0.5 \times 10^{16}$ cm$^{-3}$,
a donor concentration $N_D$ of the nitride semiconductor layer is $1 \times 10^{16}$ cm$^{-3}$, and
the nitride semiconductor device includes an insulating layer having a thickness of 10 nm between the nitride semiconductor layer and the field plate.

* * * * *